(12) United States Patent
Takaishi

(10) Patent No.: US 7,842,999 B2
(45) Date of Patent: Nov. 30, 2010

(54) SEMICONDUCTOR MEMORY DEVICE AND METHOD OF MANUFACTURING THE SAME

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 71 days.

(21) Appl. No.: 12/121,364

(22) Filed: May 15, 2008

(65) Prior Publication Data

US 2008/0283816 A1 Nov. 20, 2008

(30) Foreign Application Priority Data

May 17, 2007 (JP) ............... 2007-132165

(51) Int. Cl.
*H01L 47/00* (2006.01)
*H01L 21/20* (2006.01)

(52) U.S. Cl. ............... 257/328; 257/4; 257/330; 257/E21.09; 257/E29.262; 257/E47.001; 438/270; 438/396

(58) Field of Classification Search ............... 257/4, 257/306–309, 328, 336, 330, E21.654, E21.657, 257/E29.262, E29.268, E21.41, E21.294, 257/E21.09, E29.001, E47.001; 438/585, 438/396, 270

See application file for complete search history.

(56) References Cited

U.S. PATENT DOCUMENTS

| 5,460,994 | A | 10/1995 | Kim |
| 6,339,344 | B1 | 1/2002 | Sakata et al. |
| 2003/0146469 | A1 | 8/2003 | Matsuoka et al. |
| 2004/0150028 | A1* | 8/2004 | Horiguchi ............... 257/306 |
| 2004/0262635 | A1 | 12/2004 | Lee |
| 2008/0099814 | A1* | 5/2008 | Gruening-von Schwerin et al. ............... 257/302 |
| 2008/0283907 | A1* | 11/2008 | Takaishi ............... 257/328 |
| 2008/0296671 | A1* | 12/2008 | Takaishi ............... 257/330 |
| 2008/0296677 | A1* | 12/2008 | Takaishi ............... 257/336 |
| 2009/0065856 | A1* | 3/2009 | Oyu et al. ............... 257/329 |

FOREIGN PATENT DOCUMENTS

| JP | 05136374 | 6/1993 |
| JP | 06209089 | 7/1994 |
| JP | 07273221 A | 10/1995 |
| JP | 07321228 A | 12/1995 |
| JP | 09008295 | 1/1997 |
| JP | 2000306382 A | 11/2000 |
| JP | 2002083945 | 3/2002 |
| JP | 2003229537 A | 8/2003 |
| JP | 2003303901 | 10/2003 |
| WO | 2005010934 A2 | 2/2005 |

\* cited by examiner

*Primary Examiner*—Victor A Mandala
*Assistant Examiner*—Whitney Moore
(74) *Attorney, Agent, or Firm*—Sughrue Mion, PLLC

(57) ABSTRACT

A semiconductor device is provided with silicon pillars arranged in a matrix and formed substantially perpendicularly to a main surface of a substrate, bit lines provided above the silicon pillars, gate electrodes covering a side surface of each silicon pillars via gate insulation films, first and second diffusion layers provided at an upper part and a lower part of the silicon pillar, respectively, a reference potential wiring provided in common to the plural silicon pillars for supplying a reference potential to the first diffusion layers, and memory elements connected between the second diffusion layers and the bit lines. The gate electrodes covering the silicon pillars adjacent in a first direction crossing the bit line are in contact with each other, and gate electrodes covering the silicon pillars adjacent in a second direction parallel with the bit line are isolated from each other.

18 Claims, 28 Drawing Sheets

SEMICONDUCTOR MEMORY DEVICE AND METHOD OF MANUFACTURING THE SAME

TECHNICAL FIELD

The present invention relates to a semiconductor memory device and a method of manufacturing the same, and more particularly relates to a semiconductor memory device having a vertical transistor using a silicon pillar, and a method of manufacturing the semiconductor device.

BACKGROUND OF THE INVENTION

The integration of the semiconductor device has hitherto been achieved mainly by miniaturizing transistors. However, miniaturization of transistors has come to the limit, and when the transistors are attempted to be more miniaturized, there is a risk that the semiconductor device does not operate correctly due to the short-channel effect and the like.

As a method of basically solving this problem, there has been proposed a method of three-dimensionally processing a semiconductor substrate, thereby three-dimensionally forming a transistor. A three-dimensional transistor using a silicon pillar extending perpendicularly to the main surface of the semiconductor substrate as a channel has an advantage in that an occupied area is small and that a large drain current is obtained by a complete depletion. This three-dimensional transistor can be also used for a closest layout of $4F^2$ (see Japanese Patent Application Laid-open Nos. 2003-303901, H5-136374, H6-209089, H9-8295, and 2002-83945).

In case of using a vertical transistor having a silicon pillar as a cell transistor of a semiconductor memory device, it is general that one of diffusion layers works as a source or drain is connected to a bit line and the other diffusion layer is connected to a memory element (a cell capacitor in a DRAM). Usually, a memory element like a cell capacitor is laid out above the cell transistor. Therefore, the memory element is connected to an upper part of the silicon pillar, and a bit line is connected to a lower part of the silicon pillar.

However, because a semiconductor substrate is positioned at the lower part of the silicon pillar, it is not easy to form a bit line on the lower part of the silicon pillar, and the process becomes complex in many cases.

SUMMARY OF THE INVENTION

It is therefore an object of the present invention to provide an improved semiconductor memory device having a vertical transistor using a silicon pillar and a method of manufacturing the same.

Another object of the present invention is to provide a semiconductor memory device having a vertical transistor using a silicon pillar and capable of being manufactured in a simple process, and a method of manufacturing the same.

Still another object of the present invention is to provide a semiconductor memory device having a vertical transistor using the silicon pillar and requiring no bit line to be formed at a lower part of a silicon pillar, and a method of manufacturing the same.

The above and other objects of the present invention can be accomplished by a semiconductor memory device comprising a silicon pillar formed substantially perpendicularly to a main surface of a substrate, a bit line provided above the silicon pillar, a gate electrode covering a side surface of the silicon pillar via a gate insulation film, first and second diffusion layers provided at an upper part and a lower part of the silicon pillar, respectively, a reference potential wiring for supplying a reference potential to the first diffusion layer, and a memory element connected between the second diffusion layer and the bit line.

The "above the silicon pillar" means the opposite side of the substrate from the viewpoint of the silicon pillar. Similarly, "a lower part and an upper part of the silicon pillar" means a region at the substrate side and a region at the opposite side of the substrate, respectively from the viewpoint of the silicon pillar. Furthermore, "a lower part and an upper part of the silicon pillar" do not need to be right above and right below the silicon pillar, respectively. Further, "a lower part and an upper part of the silicon pillar" can be configured by a part of the silicon pillar, respectively, or can be configured by parts separate from the silicon pillar.

A method of manufacturing a semiconductor memory device according to the present invention includes a silicon pillars forming step of forming silicon pillars in a matrix on a semiconductor substrate by etching the semiconductor substrate using a hardmask, a first diffusion layers forming step of forming first diffusion layers at the lower part of the silicon pillars, a gate insulation films forming step of forming gate insulation films on a side surface of the silicon pillars, a gate electrodes forming step of forming gate electrodes so that gaps between the silicon pillars adjacent in a first direction crossing bit lines is substantially filled, a gate electrode isolation step of isolating the gate electrodes covering the silicon pillars adjacent in a second direction parallel with the bit lines, by etching back the gate electrodes, a second diffusion layers forming step of forming second diffusion layers at an upper part of the silicon pillars, a memory elements forming step of forming memory elements each connected to an associated one of the second diffusion layers, and a bit lines forming step of forming the bit lines connected to associated memory elements.

According to the semiconductor memory device of the present invention, the memory element is connected between the cell transistor and the bit line, instead of connecting the cell transistor between the bit line and the memory element. Therefore, the first diffusion layer positioned at a lower part of the silicon pillar can be fixed to the reference potential. Consequently, the bit line does not need to be formed at a lower part of the silicon pillar, and the manufacturing process can be simplified.

Further, according to the method of manufacturing a semiconductor memory device of the present invention, the gate electrode covering plural silicon pillars adjacent in a bit line direction is isolated by etching back the gate electrode. Therefore, patterning of the gate electrode is not necessary, and a manufacturing process can be simplified.

In the present invention, a cavity is preferably formed at least at one part between adjacent memory elements. When a memory element is connected between the cell transistor and the bit line, bit line capacitance increases due to the capacitance between adjacent memory elements. However, when a cavity is formed between the adjacent memory elements, the bit line capacitance can be substantially decreased.

The semiconductor memory device according to the present invention further includes dummy silicon pillars present in rows of the silicon pillars extending to the first direction, dummy gate electrodes covering a surface of the dummy silicon pillars via dummy insulation films; and auxiliary word lines extending to the first direction, and connected to the dummy gate electrodes, wherein the gate electrodes covering the silicon pillars adjacent to the dummy silicon pillars are in contact with the dummy gate electrodes. In the vertical transistor using the silicon pillar, the gate electrode is positioned on the side surface of the silicon pillar.

Therefore, it is not easy to connect the gate electrode to the upper-layer wiring. However, according to the above configuration, the gate electrode can be easily connected to the upper-layer wiring. In addition, because a word signal is bypassed by the auxiliary word line, operation delay of a transistor located far from a word driver can be suppressed.

As explained above, according to the present invention, because no bit line needs to be formed at a lower part of the silicon pillar, the manufacturing process can be simplified. When a cavity is formed between adjacent memory elements, bit line capacitance can be substantially decreased. Further, when a dummy gate electrode and an auxiliary word line are used, a gate electrode can be easily connected to the upper-layer wiring.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be described in detail hereinafter with reference to the accompanying drawings.

Figure 1:
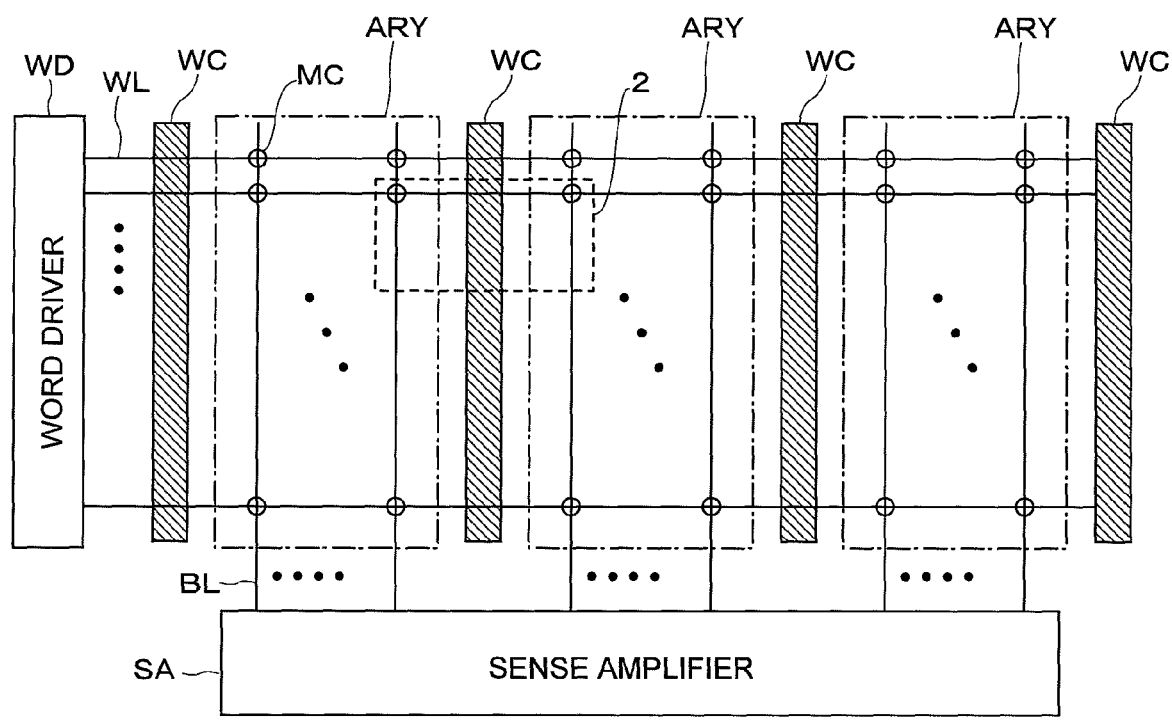
FIG. 1 is a schematic diagram showing a basic configuration of a semiconductor memory device according to a preferred embodiment of the present invention.

FIG. 1 is a schematic diagram showing a basic configuration of a semiconductor memory device according to a preferred embodiment of the present invention.

As shown in FIG. 1, the semiconductor memory device according to the present embodiment includes plural word lines WLs driven by a word driver WD, plural bit lines BLs connected to a sense amplifier SA, and memory cells MCs laid at intersections between the word lines WLs and the bit lines BLs. A cell array region ARY in which the memory cells are laid out in a matrix is isolated into several parts in an extension direction of the word lines WLs, and a word line connection region WC is provided at the end of each cell array region ARY. The word line WL includes a gate electrode and an auxiliary word line, and both are short-circuited in the word line connection region WC, as describe later.

Figure 2:
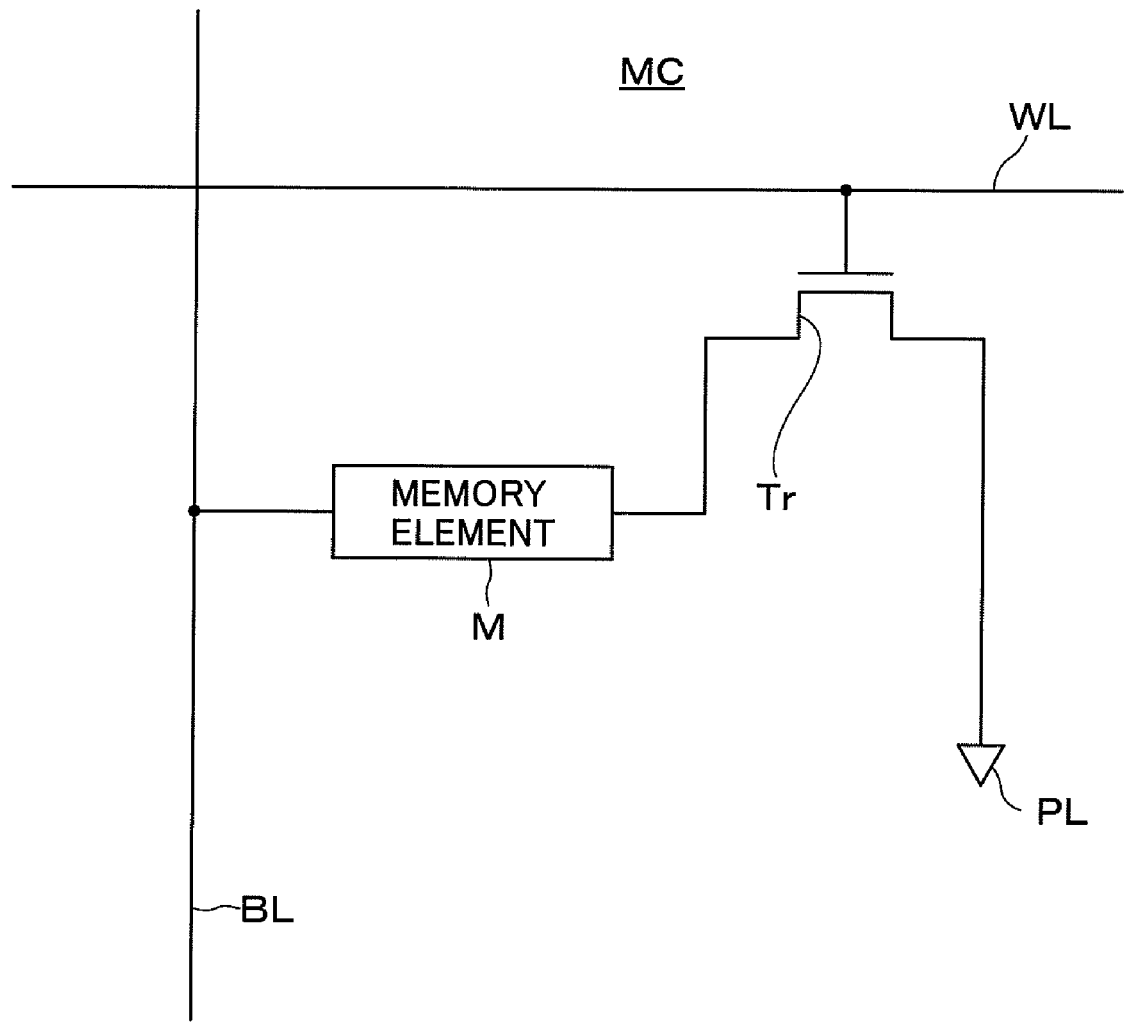
FIG. 2 is a circuit diagram of the memory cell MC.

FIG. 2 is a circuit diagram of the memory cell MC.

As shown in FIG. 2, the memory cell MC has a configuration that a memory element M and a cell transistor Tr are connected in series in this order between the bit line BL and a reference potential wiring PL. A gate of the cell transistor Tr is connected to the corresponding word line WL. While a kind of the memory element M is not particularly limited, a capacitor is used in a DRAM, and a phase-change element is used in a PRAM.

In the normal DRAM, the memory element M (capacitor) and the cell transistor Tr are at the opposite positions. That is, usually, the cell transistor Tr and the memory element M (capacitor) are connected in series in this order, between the bit lime BL and the reference potential wiring PL. However, in the semiconductor memory device according to the present embodiment, a vertical transistor using a silicon pillar as the cell transistor Tr is used as described later. The positions of the memory element M and the cell transistor Tr are therefore reversed as shown in FIG. 2.

A configuration of the semiconductor memory device according to the present embodiment will next be explained, taking an example that the memory element M is a capacitor.

Figure 3:
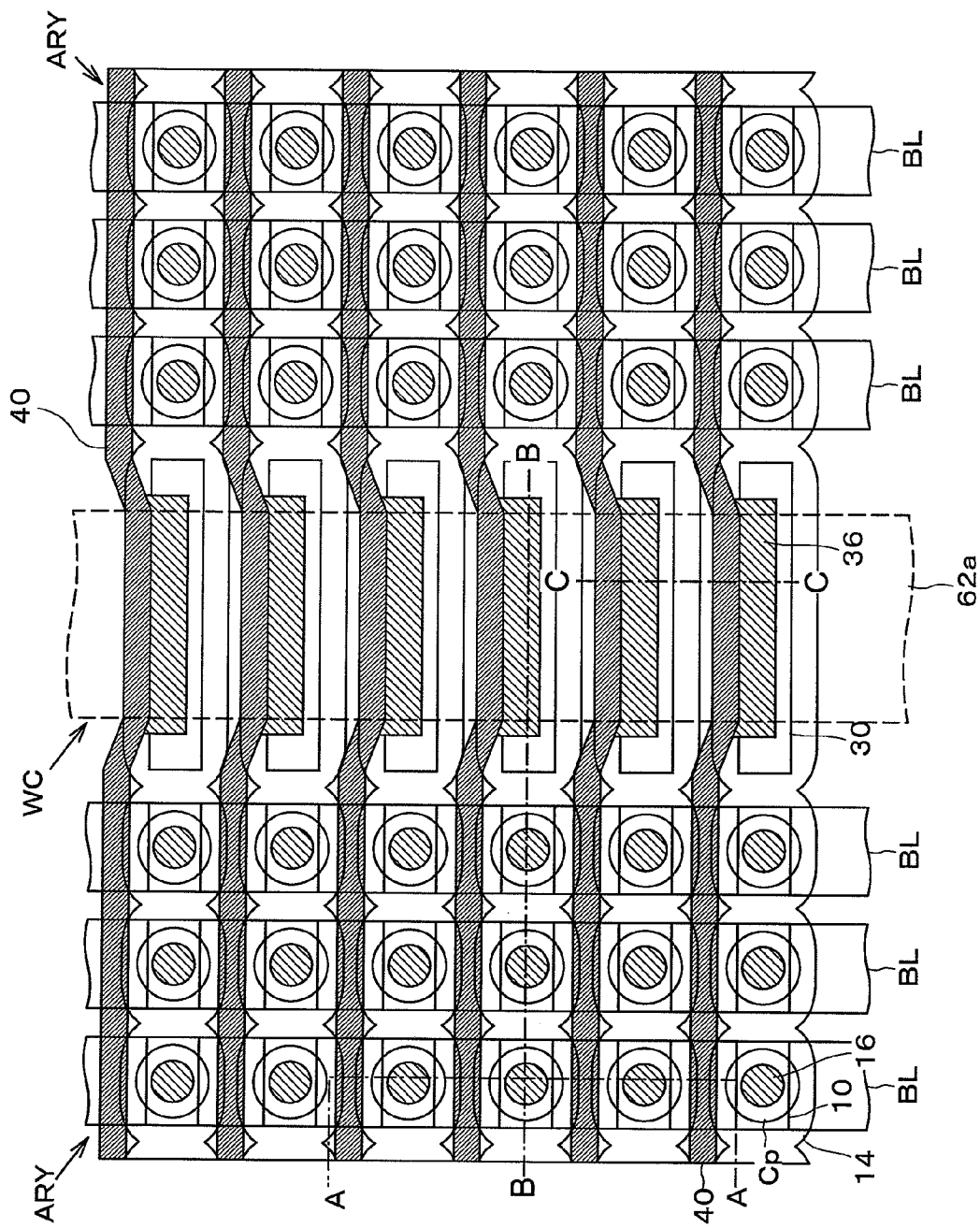
FIG. 3 is a schematic top plan view of a configuration of a region 2 shown in FIG. 1.
Figure 4:
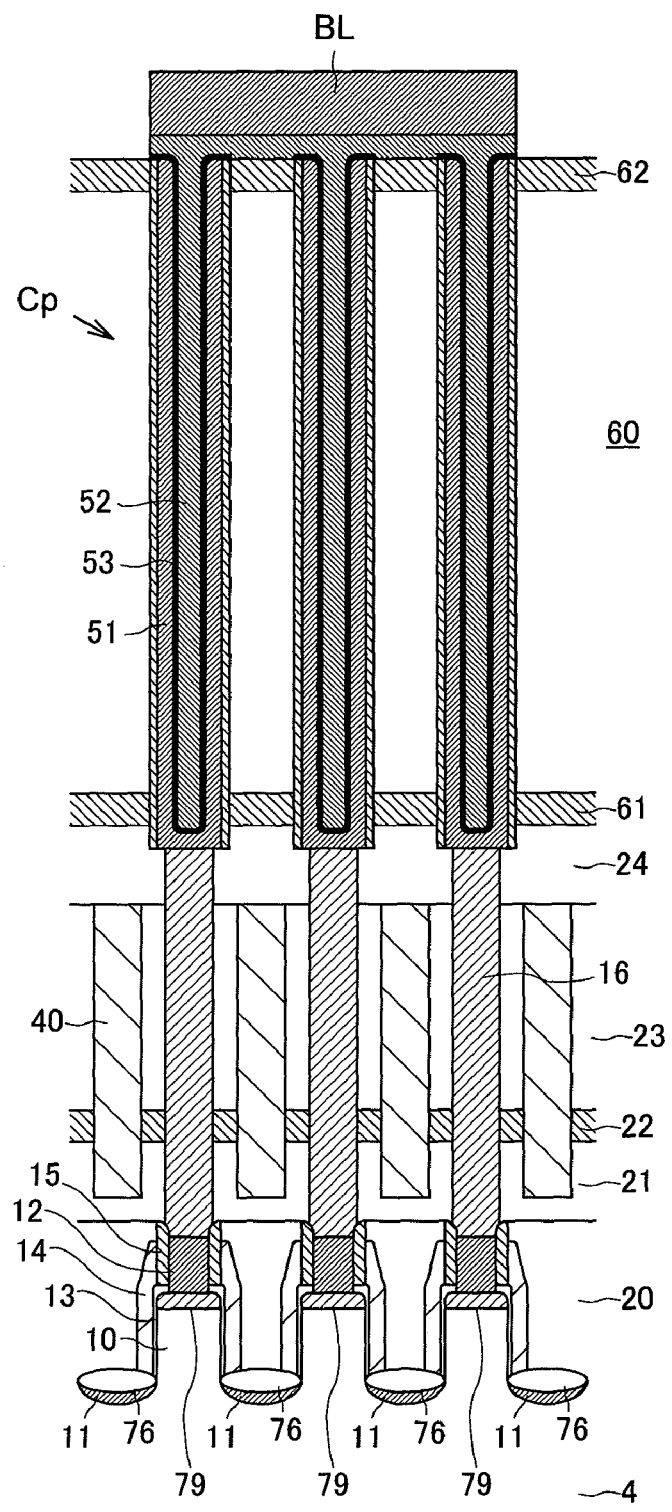
FIG. 4 is a schematic cross-sectional view along a line A-A in FIG. 3.
Figure 5:
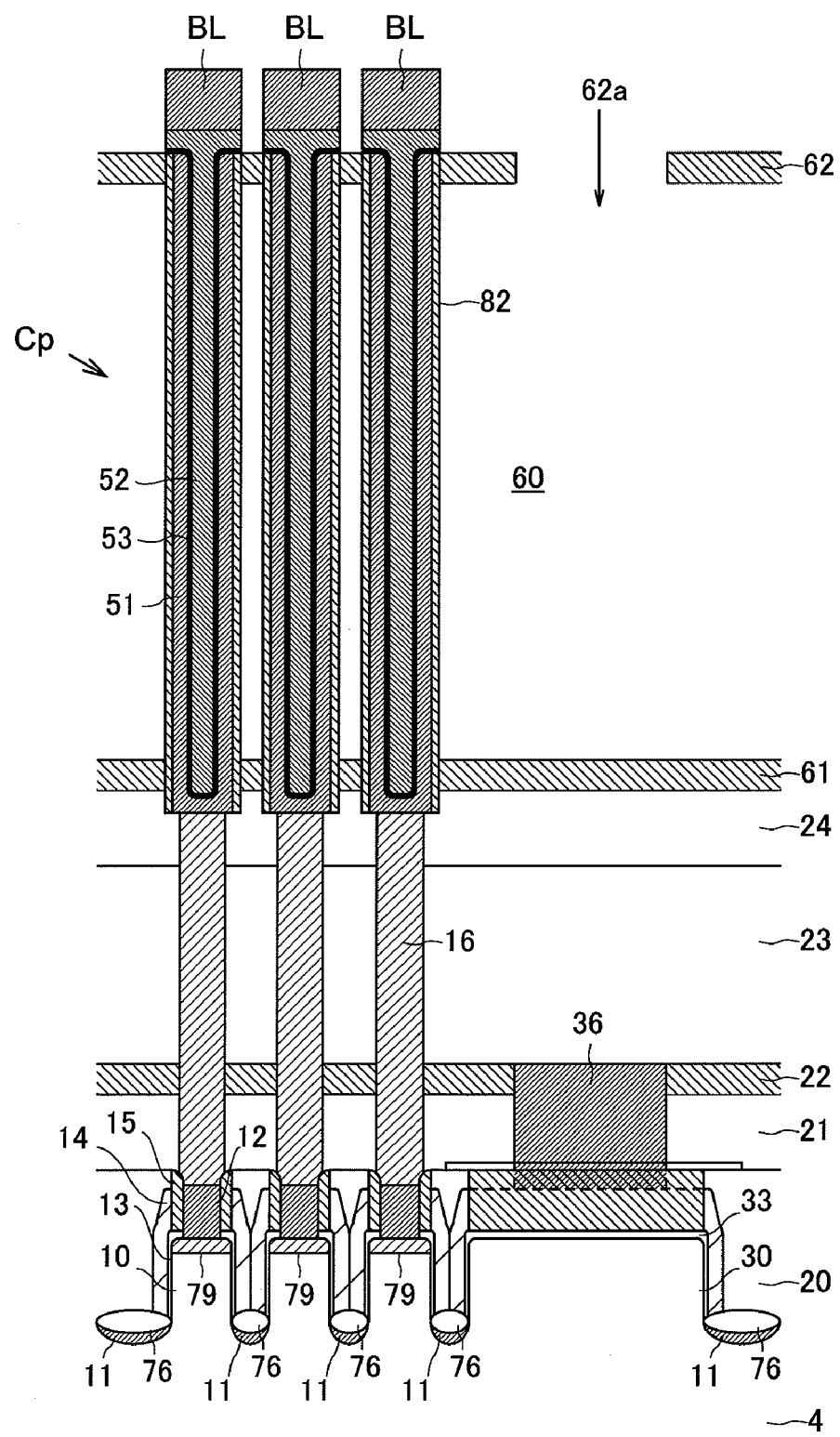
FIG. 5 is a schematic cross-sectional view along a line B-B in FIG. 3.
Figure 6:
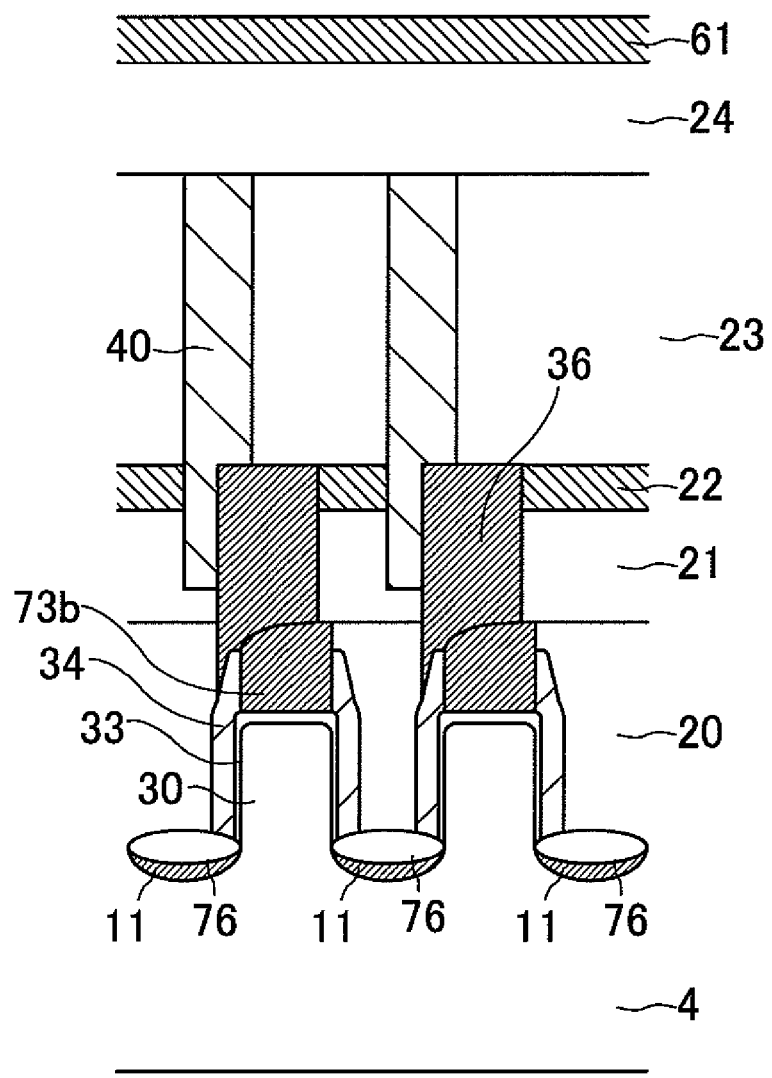
FIG. 6 is a schematic cross-sectional view along a line C-C in FIG. 3.

FIG. 3 is a schematic top plan view of a configuration of a region 2 shown in FIG. 1. FIG. 4 is a schematic cross-sectional view taken along a line A-A in FIG. 3. FIG. 5 is a schematic cross-sectional view taken along a line B-B in FIG. 3. FIG. 6 is a schematic cross-sectional view taken along a line C-C in FIG. 3. To facilitate the interpretation of the configuration shown in FIG. 3 as a schematic top plan view, a part of constituent elements is omitted.

As shown in FIG. 3 to FIG. 5, plural silicon pillars 10 formed substantially perpendicularly to a main surface of the substrate are arranged in a matrix in a cell array region ARY. A first diffusion layer 11 functioning as one of a source and a drain is formed at a lower part of the silicon pillar 10. A second diffusion layer 12 functioning as the other of the source and the drain is formed at an upper part of the silicon pillar 10. A gate electrode 14 is formed on a side surface of the silicon pillar 10 via a gate insulation film 13. These elements constitute the cell transistor Tr shown in FIG. 2.

The silicon pillar 10 becomes a channel region of the cell transistor Tr, the first diffusion layer 11 is connected to the reference potential wiring PL shown in FIG. 2, and the second diffusion layer 12 is connected to the memory element M (capacity, in the present embodiment) shown in FIG. 2. The reference potential wiring PL connected to the first diffusion layer 11 is provided in common to all silicon pillars 10 formed in the cell array region ARY. Therefore, a individual wiring such as a bit line does not need to be formed at a lower part of the silicon pillar 10, and it is sufficient that a predetermined fixed potential is supplied in the entire cell array region ARY.

An opening is formed on an insulation film covering the upper part of the silicon pillar 10, and the second diffusion layer 12 is connected to the upper part of the silicon pillar 10 via this opening. A cylindrical sidewall insulation film 15 is provided around the second diffusion layer 12, thereby insulating the second diffusion layer 12 and the gate electrode 14. The external periphery of the cylindrical sidewall insulation film 15 and the external periphery of the silicon pillar 10 are on the same flat surface. A method of manufacturing the transistor Tr described later causes this structure.

The second diffusion layer 12 is connected to a lower electrode 51 of a capacitor Cp becoming the memory element M, via a storage node contact 16 piercing through interlayer insulation films 21 to 24. An upper electrode 52 of the capacitor Cp is connected to the bit line BL.

As shown in FIG. 3, the interval between the adjacent silicon pillars 10 is set relatively small in the word line direction and relatively large in the bit line direction. Specifically, the interval between the silicon pillars 10 adjacent in the word line direction is set smaller than two times a film thickness of the gate electrode 14. On the other hand, the interval between the silicon pillars 10 adjacent in the bit line direction is set larger than two times the film thickness of the gate electrode 14. Consequently, the gate electrodes 14 covering the silicon pillars 10 adjacent in the word line direction are contact with each other. On the other hand, the gate electrodes 14 covering the silicon pillars 10 adjacent in the bit line direction are isolated from each other.

A dummy silicon pillar 30 is present in the row of the silicon pillars 10 extending to the word line direction. The region in which plural dummy silicon pillars 30 are provided in the bit line direction is the word line connection region WC shown in FIG. 1.

As shown in FIG. 5 and FIG. 6, a dummy gate electrode 34 is formed on the surface of the dummy silicon pillar 30 via a dummy gate insulation film 33. The interval between the silicon pillar 10 and the dummy silicon pillar 30 in the word line direction coincides with the interval between the silicon pillars 10 adjacent in the word line direction. Therefore, the gate electrode 14 covering the silicon pillar 10 and the dummy gate electrode 34 covering the dummy silicon pillar 30 are in contact with each other in the word line direction. The dummy gate electrode 34 is connected to an auxiliary word line 40 via a word contact 36.

The auxiliary word line 40 is a wiring extending to the word line direction, and is the wiring to connect the gate electrode 14 to the upper-layer wiring. Since the vertical transistor using the silicon pillar 10 has the silicon pillar 10 positioned on the side surface of the silicon pillar 10, it is not easy to connect the gate electrode 14 to the upper-layer wiring. However, when the dummy gate 34 covering the dummy silicon pillar 30 and the auxiliary word line 40 connected to the dummy gate electrode 34 are used, the gate electrode 14 can be easily connected to the upper-layer wiring. Because the word signal is bypassed by the auxiliary word line 40, an operation delay of the cell transistor Tr far from the word driver WD can be also suppressed. Consequently, preferably, the auxiliary word line 40 includes a material having smaller electric resistance than that of the gate electrode 14.

In the present embodiment, while the auxiliary word line 40 has a shape bent to the word contact 36 in the word line connection region WC, the auxiliary word line 40 can also have a linear shape.

As shown in FIG. 4 and FIG. 5, the capacitor Cp includes a cylinder-type lower electrode 51 connected to the storage node contact 16, a pillar-type upper electrode 52 connected to the bit line BL, and a capacitance insulation film 53 provided between the lower electrode 51 and the upper electrode 52. The capacitor Cp pierces through the interlayer insulation film 61 at the lower part, and pierces through the interlayer insulation film 62 at the upper part.

A cavity 60 is formed between the interlayer insulation film 61 and the interlayer insulation film 62. Because most adjacent capacitors Cp are adjacent via the cavity 60, capacitance between the capacitors substantially decreases. This effect is also obtained in the normal DRAM. However, because the normal DRAM is configured such that the cell transistor Tr is laid out between the capacitor Cp and the bit line BL, the capacitance between the capacitors gives small influence to the bit line capacitance. On the other hand, in the semiconductor memory device according to the present embodiment, the capacitor Cp and the cell transistor Tr are at mutually opposite positions, and the capacitor Cp is directly connected to the bit line BL. Therefore, the capacitance between the capacitors gives extremely large influence to the bit line capacitance. By considering this point, in the present embodiment, the large cavity 60 is formed between the capacitors, and the capacitance between the capacitances is decreased. As a result, the bit line capacitance is decreased.

While materials of the interlayer insulation films 61 and 62 are not particularly limited, materials different from that of a dummy interlayer insulation film (described later) to form the cavity 60 need to be selected. The dummy interlayer insulation film is present in the interlayer insulation films 61 and 62 in the manufacturing process. Preferably, a silicon oxide film can be used for the materials of the dummy interlayer insulation film. Therefore, preferably, a material capable of securing a sufficient etching rate to the silicon oxide film, such as a silicon nitride film, is used for the materials of the interlayer insulation films 61 and 62. While the materials of the interlayer insulation films 61 and 62 do not need to be the same, when the materials are the same, the etching rate to the dummy interlayer insulation film can be easily secured.

The dummy interlayer insulation film used to form the cavity 60 is removed via an opening 62a formed on the interlayer insulation film 62. The opening 62a is laid out in the word line connection region WC, as shown in FIG. 3 and FIG. 5. Because many capacitors Cp are laid out in a matrix in the cell array region ARY, it is difficult to form the opening 62a on the interlayer insulation film 62. On the other hand, no capacitor Cp is provided in the word line connection region WC, and the region becomes a vacant region. Plural capacitors Cp are cyclically provided in the word line connection region WC. Therefore, when the opening 62a is formed in this region, etchant to remove the dummy interlayer insulation film can be uniformly introduced to this region. Further, because the word line connection region WC has a long shape in the bit line direction, a sufficient opening area can be secured by forming the opening 62a in this region.

The above explains the configuration of the semiconductor memory device according to the present embodiment. As explained above, according to the semiconductor memory device of the present embodiment, the silicon pillar 10 constitutes the cell transistor Tr, and the first diffusion layer 11 positioned at the lower part of the silicon pillar 10 is connected in common to the reference potential wiring PL. Therefore, an individual wiring such as a bit line does not need to be formed at the lower part of the silicon pillar 10, and the manufacturing process can be simplified. A method of manufacturing a semiconductor memory device according to the present embodiment is explained below.

FIG. 7 to FIG. 40 are process diagrams for explaining a method of manufacturing the semiconductor memory device according to the present embodiment. FIG. 7 to FIG. 40 sequentially show cross sections corresponding to the cross section B-B shown in FIG. 3.

Figure 7:
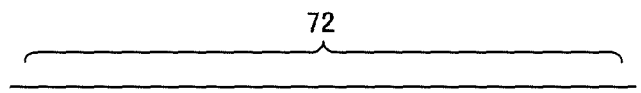
FIG. 7 is a schematic cross-sectional view showing a process for manufacturing the semiconductor device 10 according to the present embodiment (specifically forming active regions 27)

In manufacturing the semiconductor device, a silicon substrate 71 is prepared first, and an STI (Shallow Trench Isolation) (not shown) is formed on this silicon substrate 71, thereby forming an active region 72 isolated by STI (FIG. 7).

Figure 8:
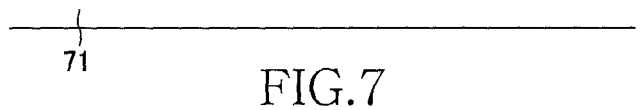
FIG. 8 is a schematic cross-sectional view showing a process for manufacturing the semiconductor device 10 according to the present embodiment (specifically forming a hardmask 73)
Figure 9:
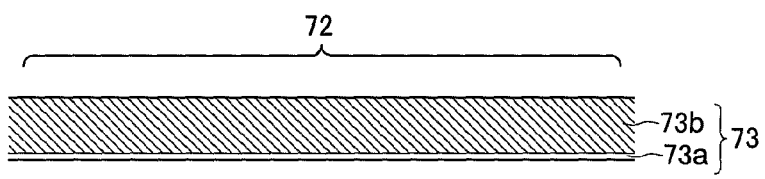
FIG. 9 is a schematic cross-sectional view showing a process for manufacturing the semiconductor device 10 according to the present embodiment (specifically patterning the hardmask 73)
Figure 10:
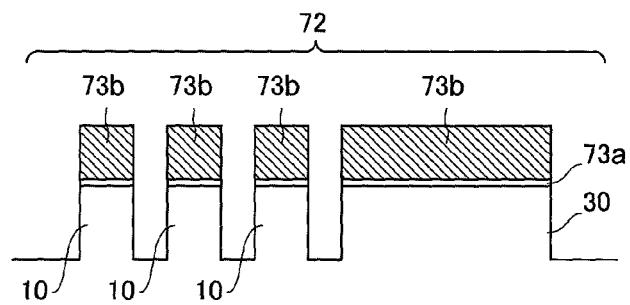
FIG. 10 is a schematic cross-sectional view showing a process for manufacturing the semiconductor device 10 according to the present embodiment (specifically forming silicon pillars 10 and dummy silicon pillars 30)

Next, the silicon pillar 10 and the dummy silicon pillar 30 are simultaneously formed within the active region 72. In forming the silicon pillar 10 and the dummy silicon pillar 30, a hardmask 73 including a silicon oxide film 73a and a silicon nitride film 73b is formed on the entire surface of the substrate (FIG. 8). While not particularly limited, the silicon oxide film 73a and the silicon nitride film 73b can be formed by the CVD method. Preferably, the silicon oxide film 73a has a thickness of about 5 nm, and the silicon oxide film 73b has a thickness of about 120 nm. Thereafter, the hardmask 73 is patterned, thereby leaving the hardmask 73 in the region where the silicon pillar 10 and the dummy silicon pillar 30 are to be formed, and removing other hardmask 73 (FIG. 9). Further, the exposed surface of the active region 72 is etched using the patterned hardmask 73 (FIG. 10). In this etching process, a recess is formed on the exposed surface of the active region 72. Apart not etched becomes the silicon pillar 10 and the dummy silicon pillar 30 substantially perpendicular to the main surface of the silicon substrate 71. The upper surfaces of the silicon pillar 10 and the dummy silicon pillar 30 are covered by the hardmask 73.

Figure 11:
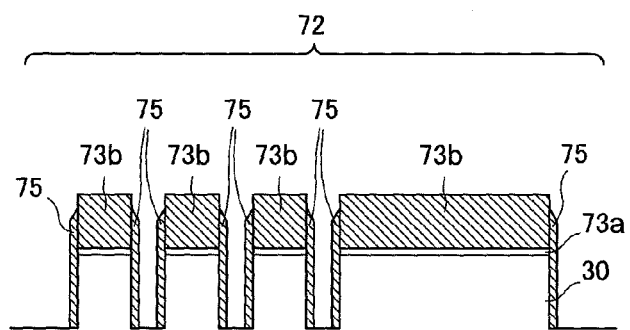
FIG. 11 is a schematic cross-sectional view showing a process for manufacturing the semiconductor device 10 according to the present embodiment (specifically forming sidewall insulation films 75)

Next, a sidewall insulation film 75 is formed on the side surfaces of the silicon pillar 10 and the dummy silicon pillar 30 (FIG. 11). The sidewall insulation film 75 can be formed by forming a silicon nitride film on the entire surface of the substrate by the CVD method, without removing the hardmask 73 as it is, and then etching back the silicon nitride film. Accordingly, the sidewalls of the silicon pillar 10 and the dummy silicon pillar 30 becomes in the state of being covered by the sidewall insulation film 75. On the other hand, a gap between the silicon pillars 10 is not covered by the sidewall insulation film 75, and is in the exposed state.

Figure 12:
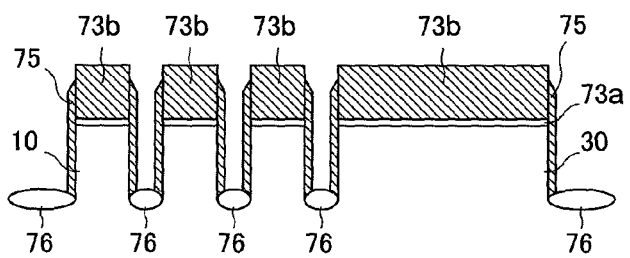
FIG. 12 is a schematic cross-sectional view showing a process for manufacturing the semiconductor device 10 according to the present embodiment (specifically forming silicon oxide films 76)

Next, a silicon oxide film 76 is formed on the exposed surface of the active region 72 (that is, the bottom surface of the active region 72) by thermal oxidation (FIG. 12). In this case, the upper surfaces and the side surfaces of the silicon pillar 10 and the dummy silicon pillar 30 are covered by the hardmask 73 and the sidewall insulation film 75, respectively, and therefore, are not thermally oxidized. While not particularly limited, preferably, the thickness of the silicon oxide film 76 is about 30 nm.

Figure 13:
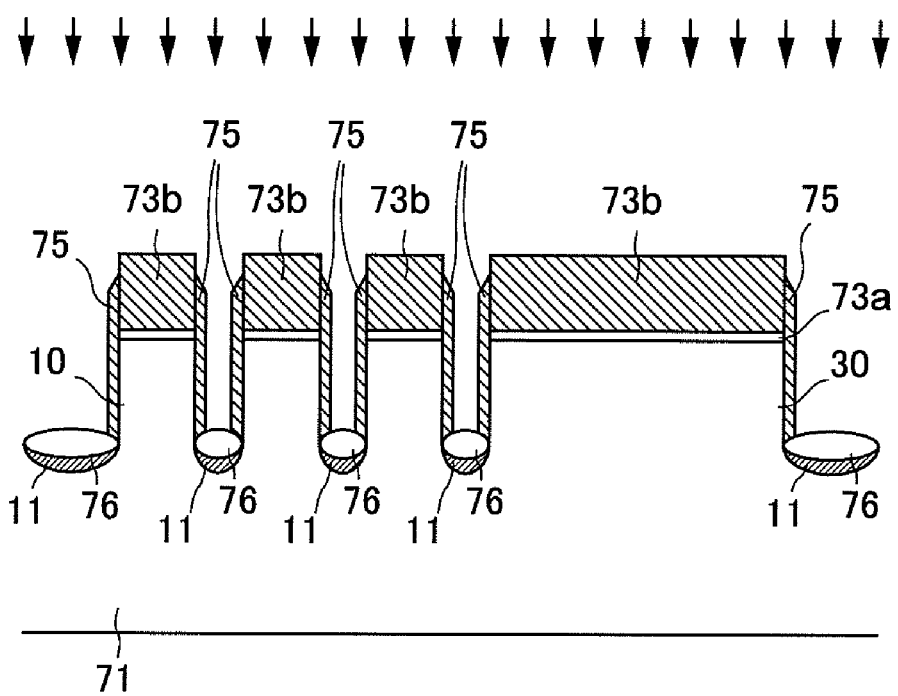
FIG. 13 is a schematic cross-sectional view showing a process for manufacturing the semiconductor device 10 according to the present embodiment (specifically forming first diffusion layer 11)

Next, the first diffusion layer 11 is formed at the lower parts of the silicon pillar 10 and the dummy silicon pillar 30 (FIG. 13). The first diffusion layer 11 can be formed by ion-implanting an impurity having conductivity opposite to that of the impurity in the silicon substrate, via the silicon oxide film 76 formed on the surface of the active region 72.

Figure 14:
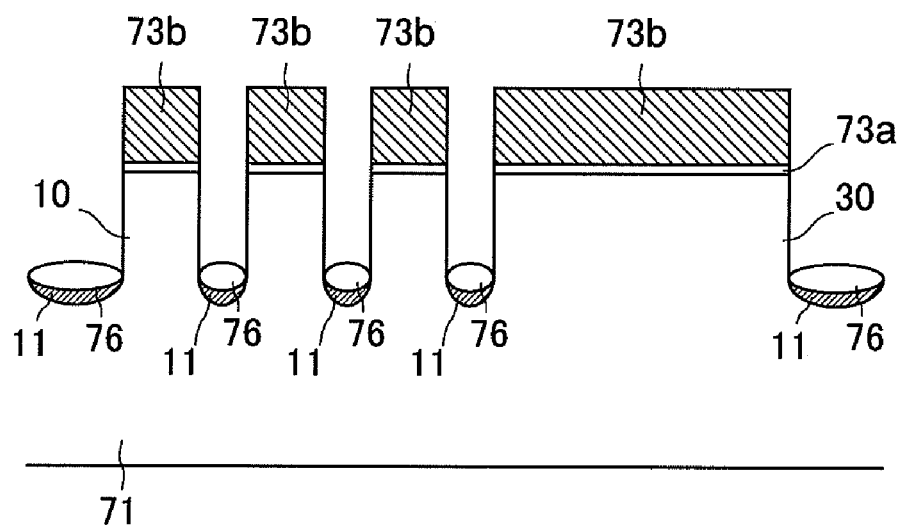
FIG. 14 is a schematic cross-sectional view showing a process for manufacturing the semiconductor device 10 according to the present embodiment (specifically removing the sidewall insulation films 75)

Next, the sidewall insulation film 75 is removed by wet etching (FIG. 14). As a result, the side surfaces of the silicon oxide film 76 formed on the bottom surface of the active region 72, the silicon pillar 130 and the dummy silicon pillar 30 are exposed again. The upper surfaces of the silicon pillar 10 and the dummy silicon pillar 30 are kept covered by the hardmask 73.

Figure 15:
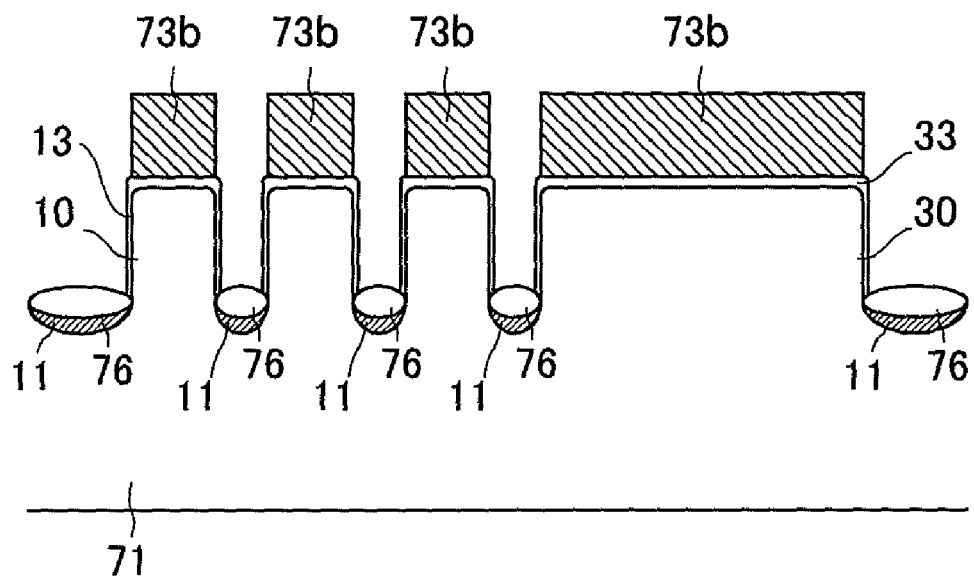
FIG. 15 is a schematic cross-sectional view showing a process for manufacturing the semiconductor device 10 according to the present embodiment (specifically forming gate insulation films 13 and dummy gate insulation film 33)
Figure 16:
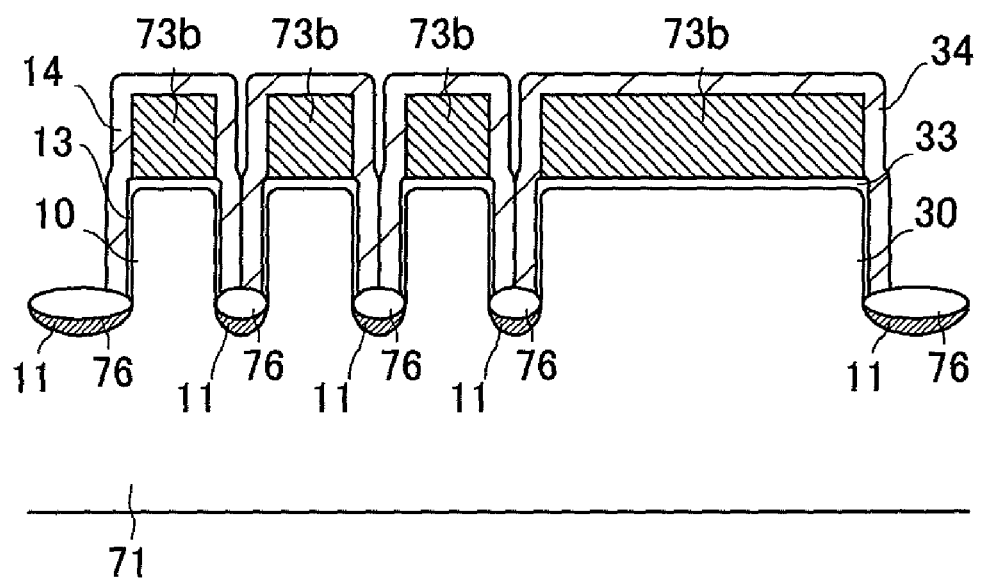
FIG. 16 is a schematic cross-sectional view showing a process for manufacturing the semiconductor device 10 according to the present embodiment (specifically forming a polycrystalline silicon film)

The gate insulation film 13 and the dummy gate insulation film 33 are then simultaneously formed on the side surfaces of the silicon pillar 10 and the dummy silicon pillar 30 (FIG. 15). The gate insulation film 13 and the dummy gate insulation film can be formed by thermal oxidation, and, preferably, thicknesses of these films are about 5 nm.

Figure 17:
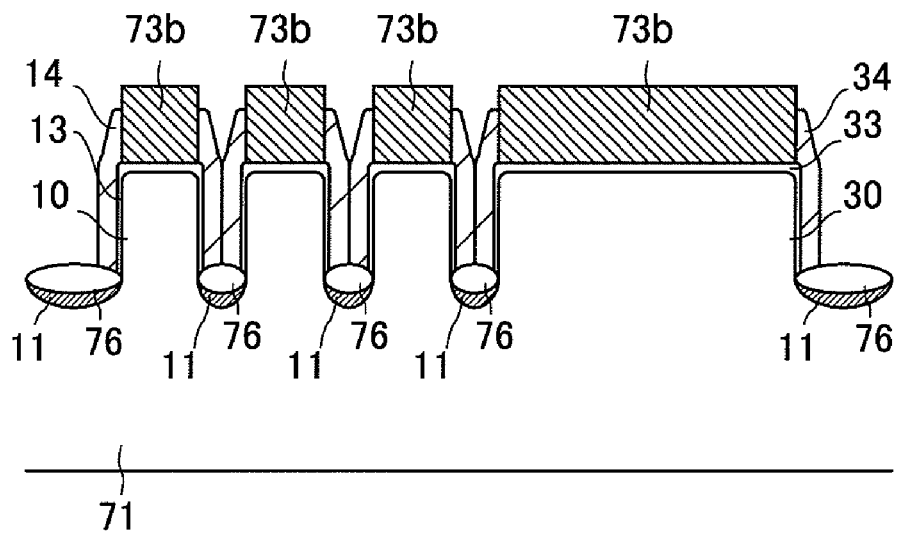
FIG. 17 is a schematic cross-sectional view showing a process for manufacturing the semiconductor device 10 according to the present embodiment (specifically etching back the polycrystalline silicon film)

Next, the gate electrode 14 and the dummy gate electrode 34 are formed. The gate electrode 14 and the dummy gate electrode 34 can be formed by forming a polycrystalline silicon film having a thickness of about 30 nm on the entire surface of the substrate by the CVD method (FIG. 16), and then etching back the polycrystalline silicon film (FIG. 17). Consequently, a side surface of the silicon pillar 10 formed with the gate insulation film 13 becomes in the state of being covered by the gate electrode 14, and a side surface of the dummy silicon pillar 30 formed with the dummy gate insulation film 33 becomes in the state of being covered by the dummy gate electrode 34. Because the interval between the silicon pillars 10 adjacent in the word line direction is set smaller than two times the film thickness of the gate electrode 14, the gate electrodes 14 covering the silicon pillar 10 are mutually in a contact state. The adjacent gate electrode 14 and the dummy gate electrode 34 are also in a similar contact state. On the other hand, because the interval between the silicon pillars 10 adjacent in the bit line direction is set more than two times the film thickness of the gate electrode 14, the gate electrodes 14 covering the silicon pillar 10 are isolated from each other.

Figure 18:
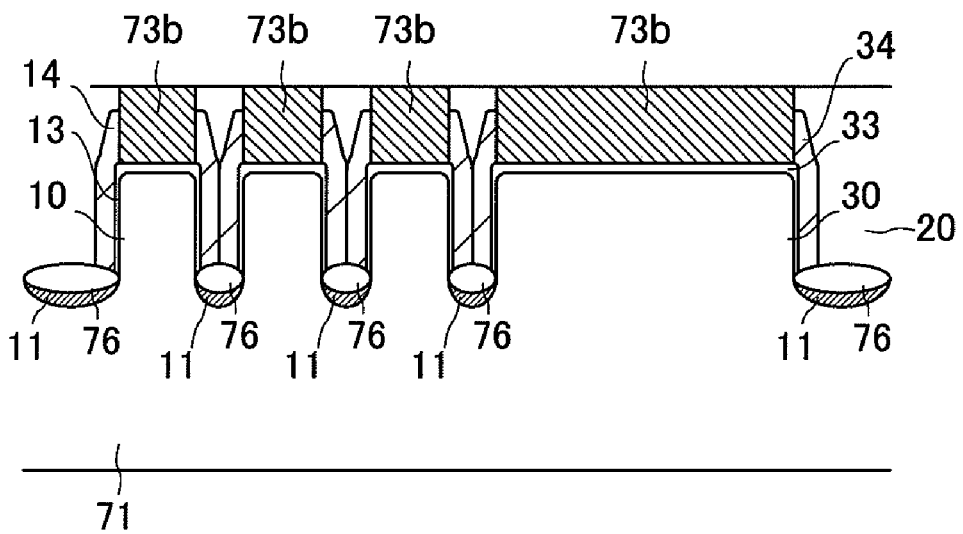
FIG. 18 is a schematic cross-sectional view showing a process for manufacturing the semiconductor device 10 according to the present embodiment (specifically forming an interlayer insulation film 20)

Next, the interlayer insulation film 20 including a silicon nitride film is formed on the entire surface of the substrate, and the entire surface of the interlayer insulation film 20 is planarized by the CMP method (FIG. 18). In this case, the silicon nitride film 73*b* constituting the hardmask 73 serves as a CMP stopper. Therefore, the thickness of the interlayer insulation film 20 can be securely controlled. As a result, the active region 72 becomes in the state of being embedded by the interlayer insulation film 20.

Figure 19:
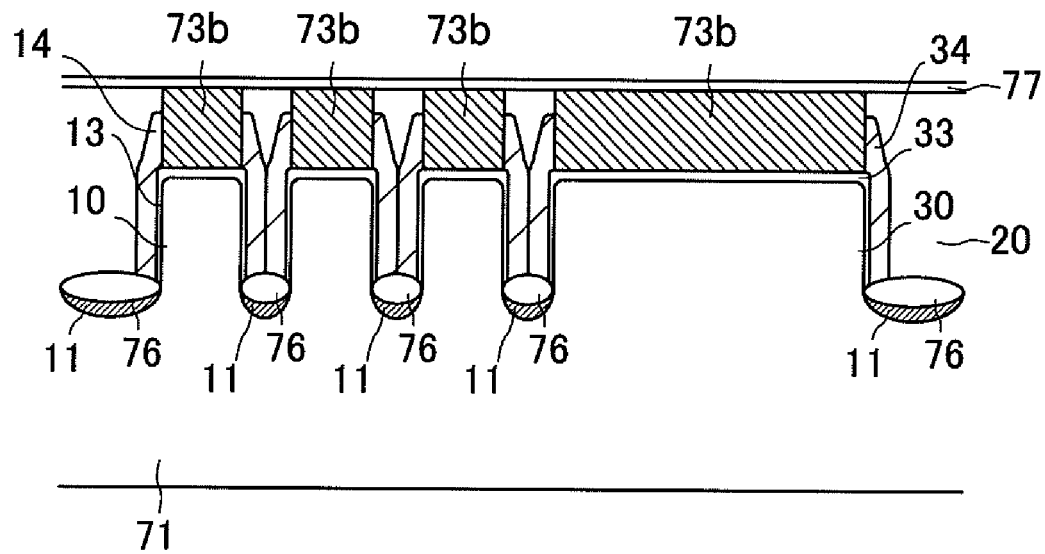
FIG. 19 is a schematic cross-sectional view showing a process for manufacturing the semiconductor device 10 according to the present embodiment (specifically forming a mask oxide film 77)
Figure 20:
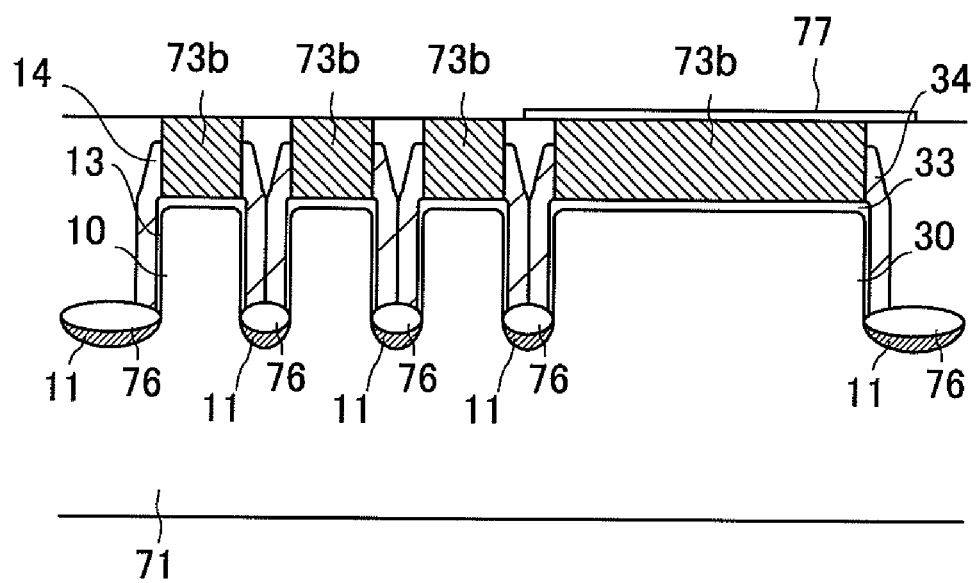
FIG. 20 is a schematic cross-sectional view showing a process for manufacturing the semiconductor device 10 according to the present embodiment (specifically patterning the mask oxide film 77)
Figure 21:
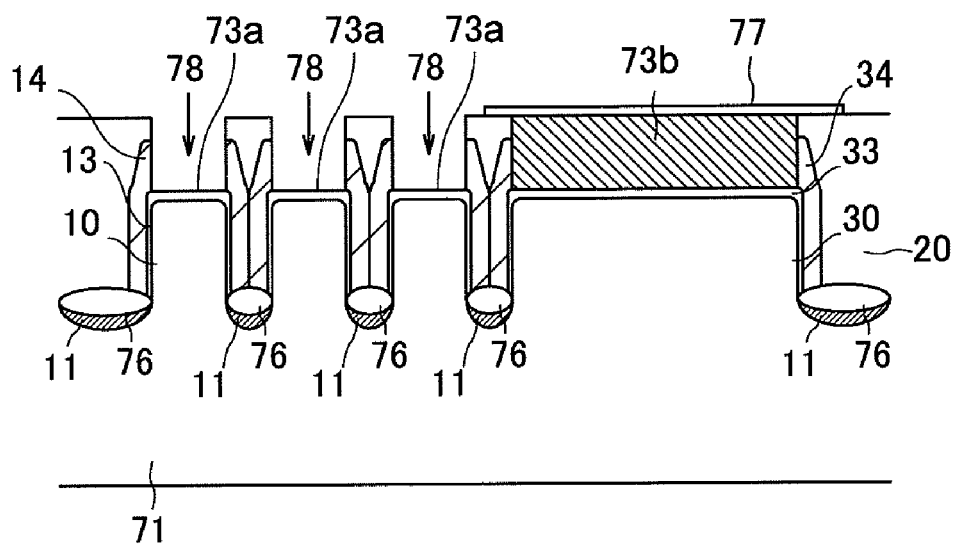
FIG. 21 is a schematic cross-sectional view showing a process for manufacturing the semiconductor device 10 according to the present embodiment (specifically removing a part of the silicon nitride film 73b)

Next, the hardmask 73 provided above the silicon pillar 10 is selectively removed, thereby forming a through-hole (opening) 78. In forming the through-hole 78, a mask oxide film 77 including a silicon oxide film is first formed on the entire surface of the substrate (FIG. 19). The mask oxide film 77 can be formed by the CVD method. Preferably, a thickness of the mask oxide film 77 is about 5 nm. Next, the mask oxide film 77 is patterned so that the silicon nitride film 73*b* formed above the silicon pillar 10 is exposed (FIG. 20). In this case, the silicon nitride film 73*b* formed above the dummy silicon pillar 30 is kept covered by the mask oxide film 77. Thereafter, the exposed silicon nitride film 73*b* is removed by dry etching or wet etching, thereby forming the through-holes 78 having the silicon oxide film 73*a* as a bottom surface (FIG. 21).

The through-holes 78 are formed by removing the silicon nitride film 73*b* used as a mask to form the silicon pillar 10, and is, therefore, formed in self-alignment to the silicon pillar 10. Consequently, the inner wall surface of the through-holes 78 and the external periphery of the silicon pillar 10 are on the same surface.

Figure 22:
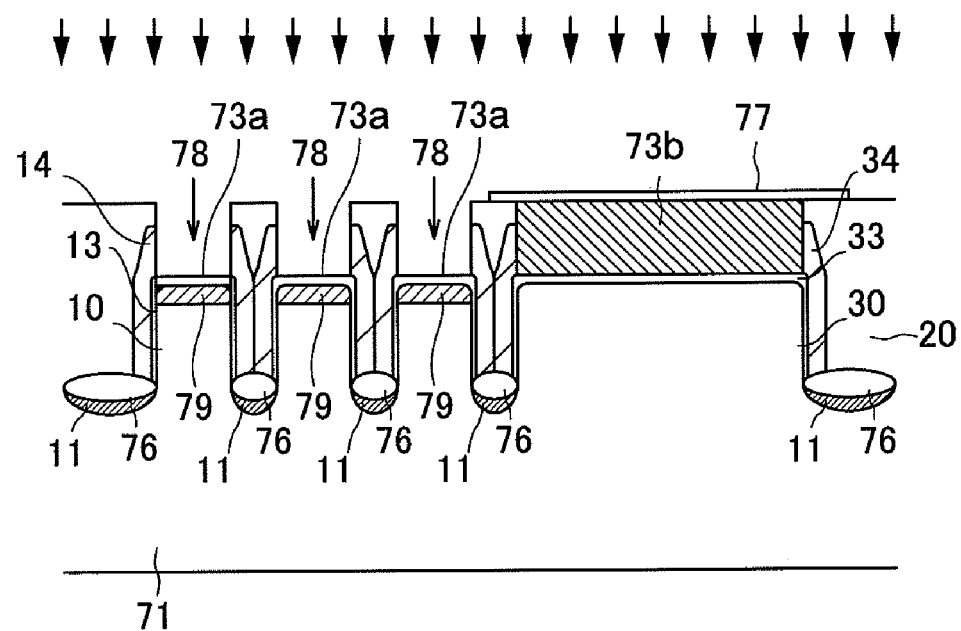
FIG. 22 is a schematic cross-sectional view showing a process for manufacturing the semiconductor device 10 according to the present embodiment (specifically forming LDD region 79)

Next, an LDD (Lightly Doped Drain) region 79 is formed on the upper part of the silicon pillar 10 (FIG. 22). The LDD region 79 can be formed by ion-implanting an impurity having conductivity opposite to the impurity in the silicon substrate, via the silicon oxide film 73*a* formed on the upper part of the silicon pillar 10.

Figure 23:
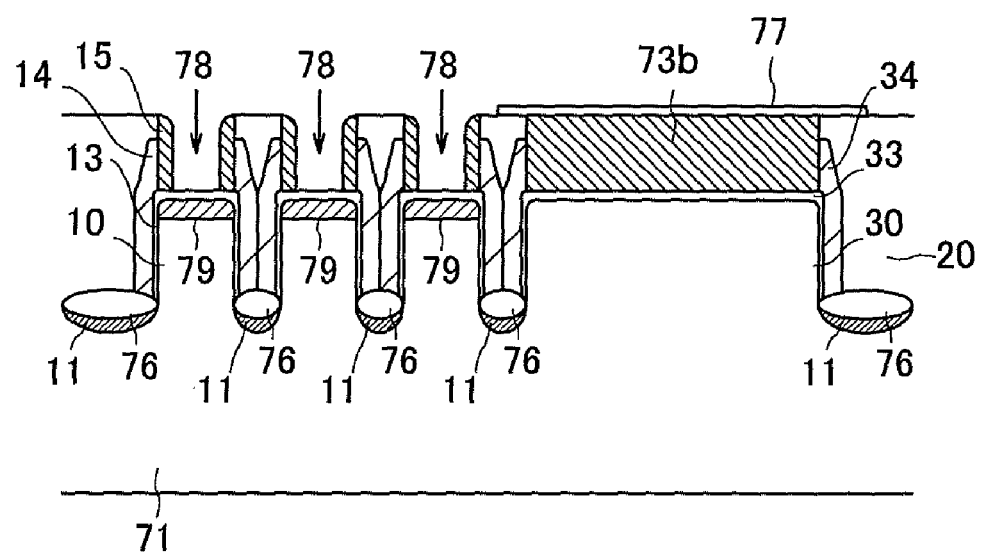
FIG. 23 is a schematic cross-sectional view showing a process for manufacturing the semiconductor device 10 according to the present embodiment (specifically forming sidewall insulation films 15)
Figure 24:
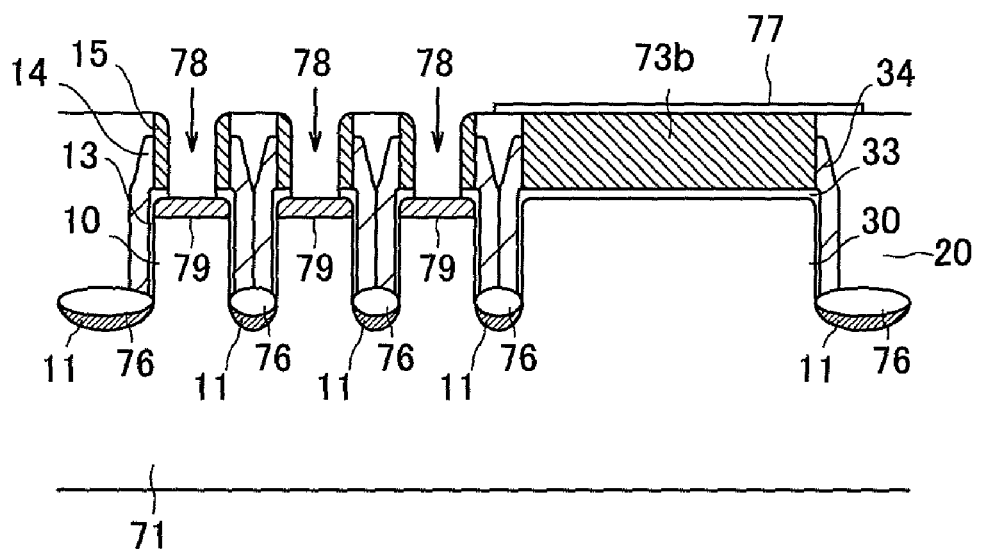
FIG. 24 is a schematic cross-sectional view showing a process for manufacturing the semiconductor device 10 according to the present embodiment (specifically forming openings)

Next, the sidewall insulation film 15 is then formed on the inner wall of the through-holes 78 (FIG. 23). The sidewall insulation film 15 can be formed by forming a silicon nitride film on the entire surface of the substrate, and then etching back the silicon nitride film. While not particularly limited, preferably, the thickness of the silicon nitride film is about 10 nm. In this way, the sidewall insulation film 15 is formed on the inner wall surface of the through-holes 78, and the through-holes 78 are formed by removing the silicon nitride film as a hardmask used to form the silicon pillar 10. Therefore, the position of the external periphery of the cylindrical sidewall insulation film 15 and the position of the external periphery of the silicon pillar 10 coincide with each other.

Figure 25:
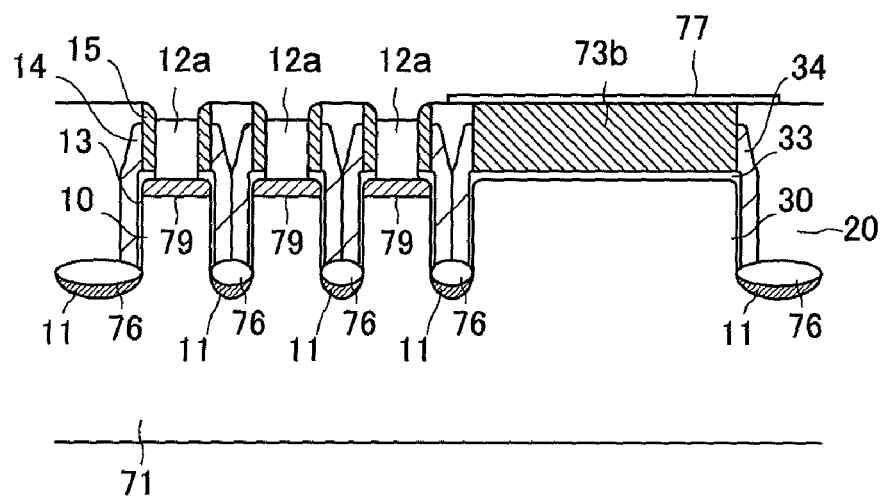
FIG. 25 is a schematic cross-sectional view showing a process for manufacturing the semiconductor device 10 according to the present embodiment (specifically forming a silicon epitaxial layer 12a)
Figure 26:
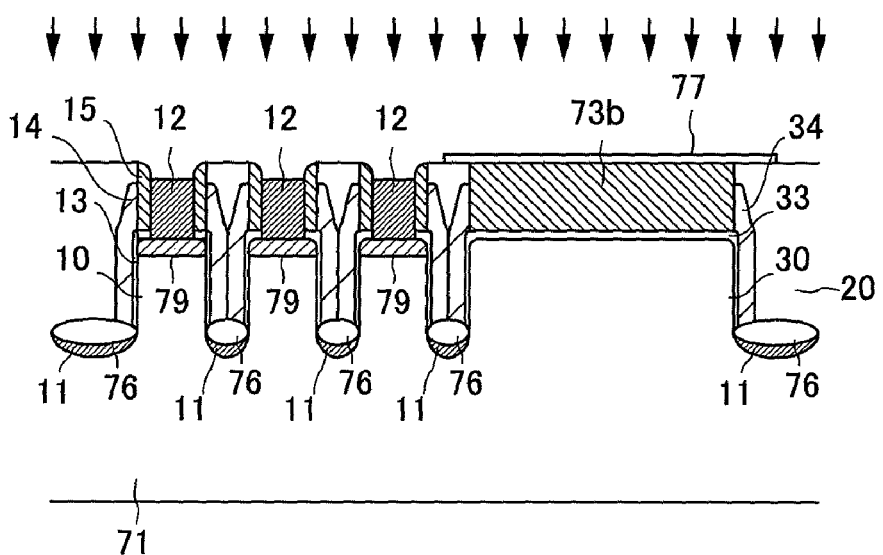
FIG. 26 is a schematic cross-sectional view showing a process for manufacturing the semiconductor device 10 according to the present embodiment (specifically forming second diffusion layer 12)
Figure 27:
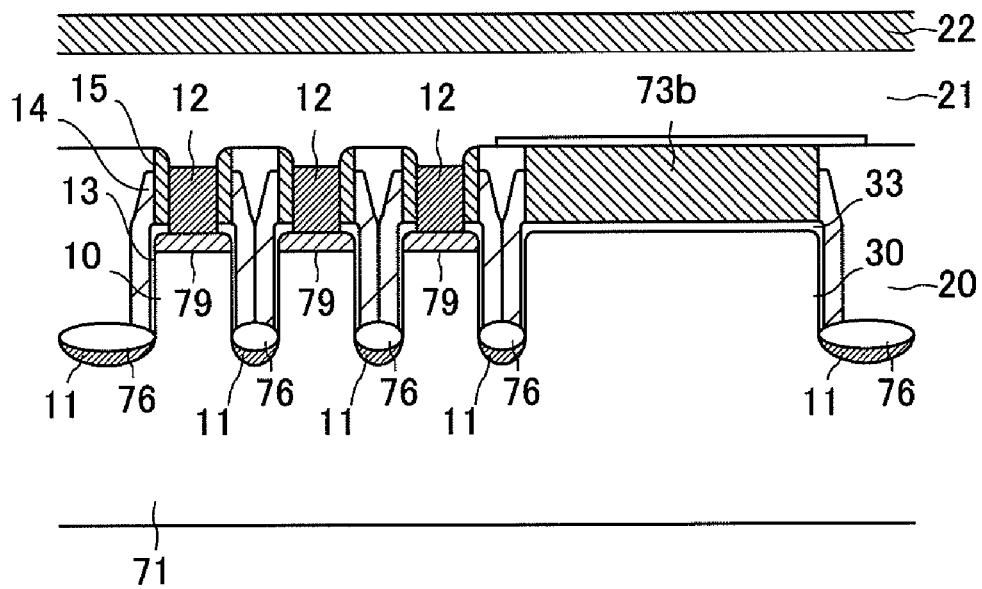
FIG. 27 is a schematic cross-sectional view showing a process for manufacturing the semiconductor device 10 according to the present embodiment (specifically forming interlayer insulating layer 21 and silicon nitride film 22)

Next, the second diffusion layers 12 are formed on the upper part of the silicon pillars 10. In forming the second diffusion layers 12, the through-holes 78 are first formed and the silicon oxide film 73*a* at the bottom of the through-holes 78 is removed (FIG. 24), and then, silicon epitaxial layers 12*a* are formed within the through-hole 78 by a selective epitaxial growth method (FIG. 25). Thereafter, an impurity having the conductivity opposite to that of the impurity in the silicon substrate is ion-implanted, thereby forming the second diffusion layers 12 (FIG. 26). As a result, the second diffusion layers 12 are formed in self-alignment to the silicon pillars 10.

Figure 28:
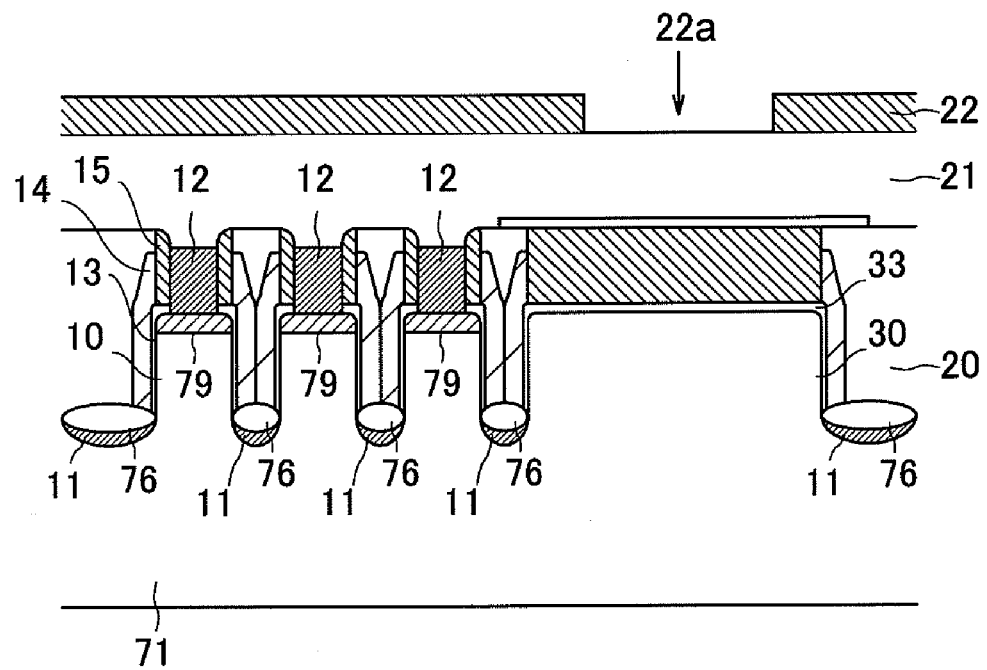
FIG. 28 is a schematic cross-sectional view showing a process for manufacturing the semiconductor device 10 according to the present embodiment (specifically forming an opening 22a)

Next, the interlayer insulation film 21 and the silicon nitride film 22 are sequentially formed on the entire surface of the substrate (FIG. 27), and the silicon nitride film 22 is patterned, thereby forming the opening 22*a* above the dummy silicon pillar 30 (FIG. 28).

Figure 29:
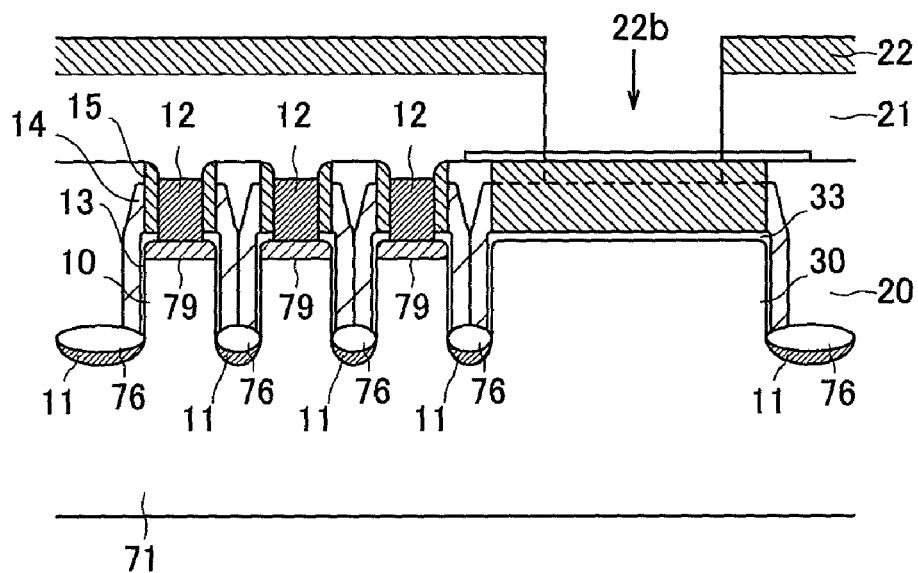
FIG. 29 is a schematic cross-sectional view showing a process for manufacturing the semiconductor device 10 according to the present embodiment (specifically forming contact-holes)
Figure 30:
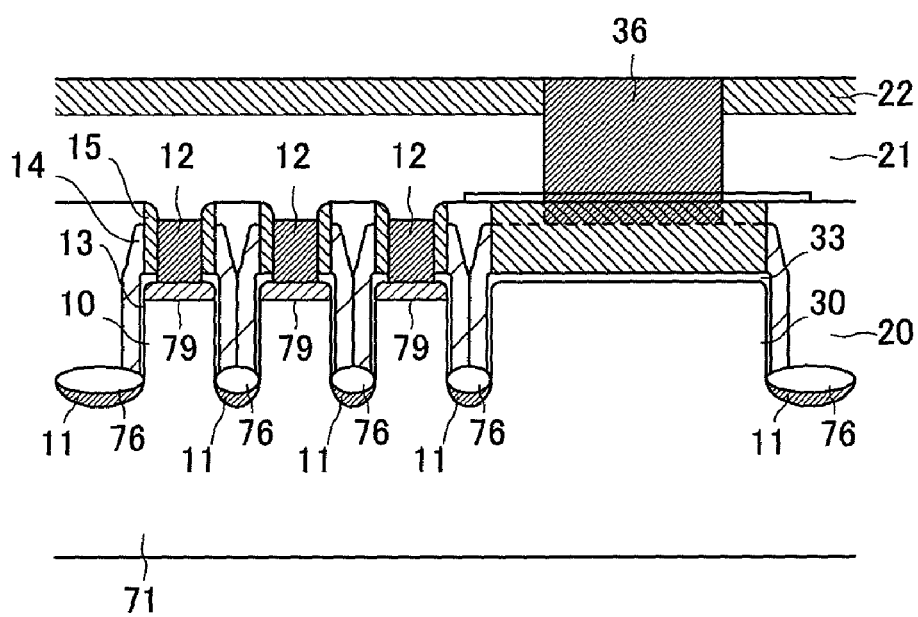
FIG. 30 is a schematic plan view showing a process for manufacturing the semiconductor device 10 according to the present embodiment (specifically forming word contacts 36)
Figure 31:
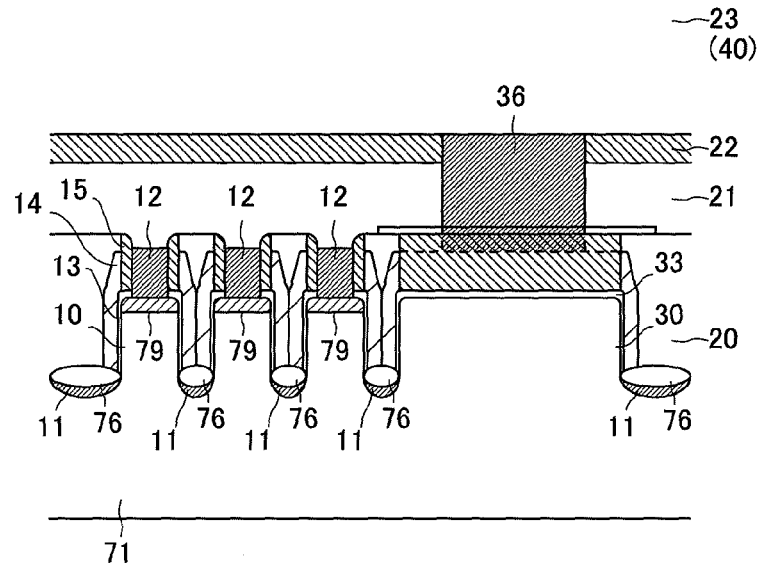
FIG. 31 is a schematic cross-sectional view showing a process for manufacturing the semiconductor device 10 according to the present embodiment (specifically forming an interlayer insulation film 23)

Next, the interlayer insulation film 21 is dry etched using the silicon nitride film 22 as a mask, thereby forming a contact hole 22b piercing through the interlayer insulation film 21 (FIG. 29). The contact hole is embedded with a polycrystalline silicon film to form the word contact 36 (FIG. 30). Further, the interlayer insulation film 23 is formed (FIG. 31), and then a slit (not shown) is formed in the word line direction to form the auxiliary word line 40 on the interlayer insulation film 23. The slit is embedded with a low-resistance material to form the auxiliary word line 40 (not shown) connected to the dummy gate electrode 34.

Figure 32:
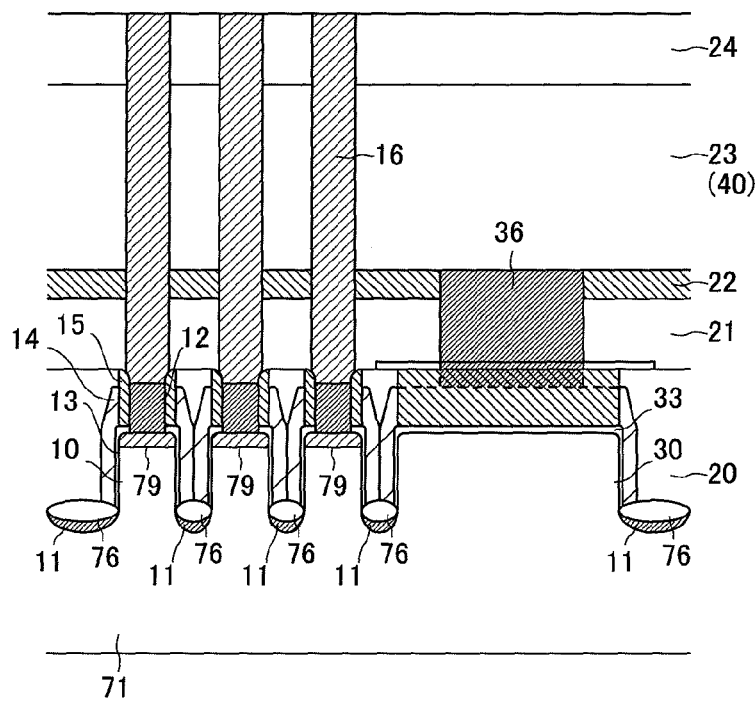
FIG. 32 is a schematic plan view showing a process for manufacturing the semiconductor device 10 according to the present embodiment (specifically forming storage node contacts 16)

The interlayer insulation film 24 is formed, and next, the storage node contact 16 piercing through the interlayer insulation films 21 to 24 is formed (FIG. 32). The storage node contact 16 can be formed by forming a contact hole above each silicon pillar 10, and by embedding the contact hole with a polycrystalline silicon film. As a result, the storage node contact 16 is connected to the second diffusion layer 12.

Figure 33:
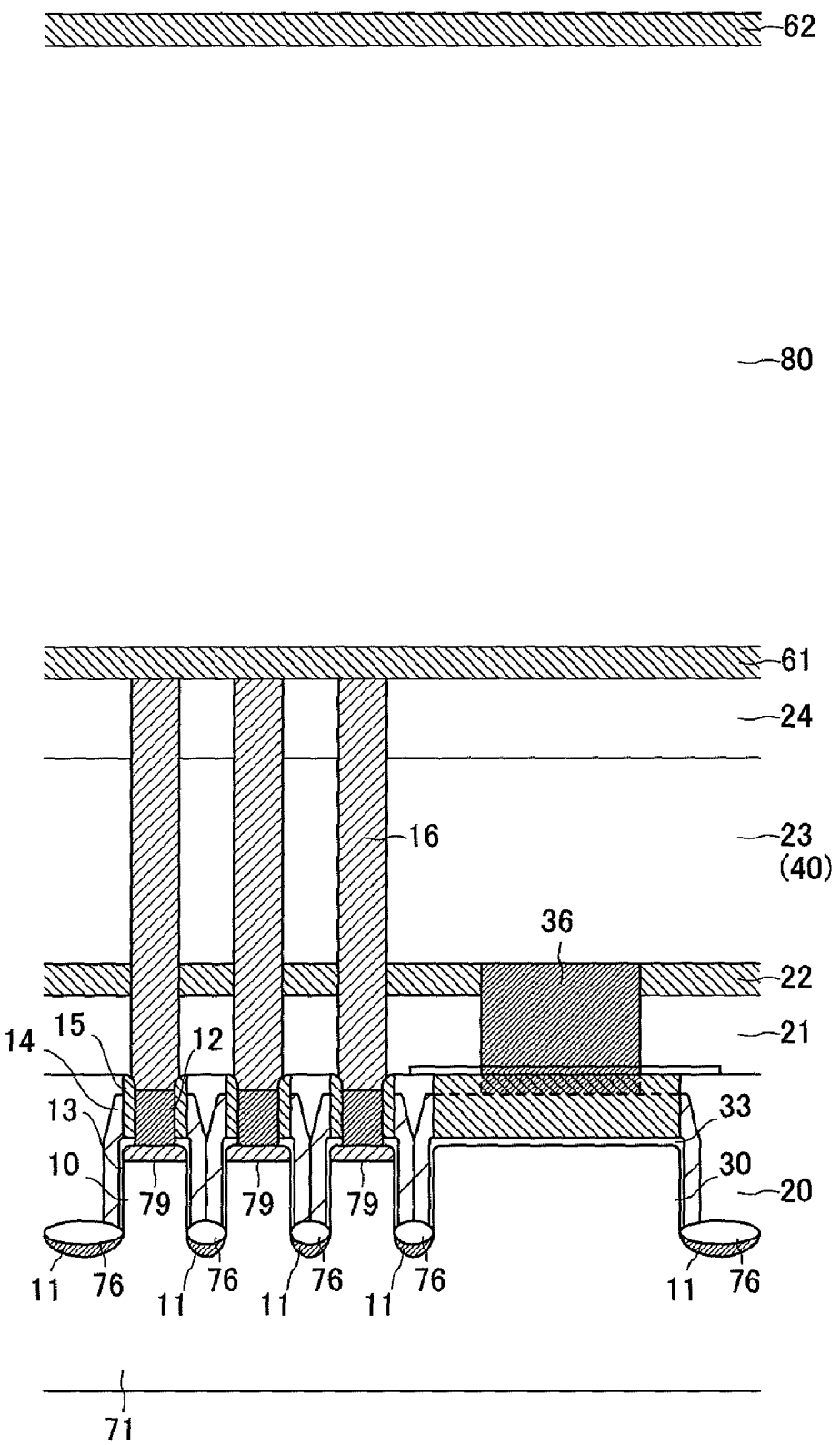
FIG. 33 is a schematic plan view showing a process for manufacturing the semiconductor device 10 according to the present embodiment (specifically forming interlayer insulation films 61, 80 and 62)
Figure 34:
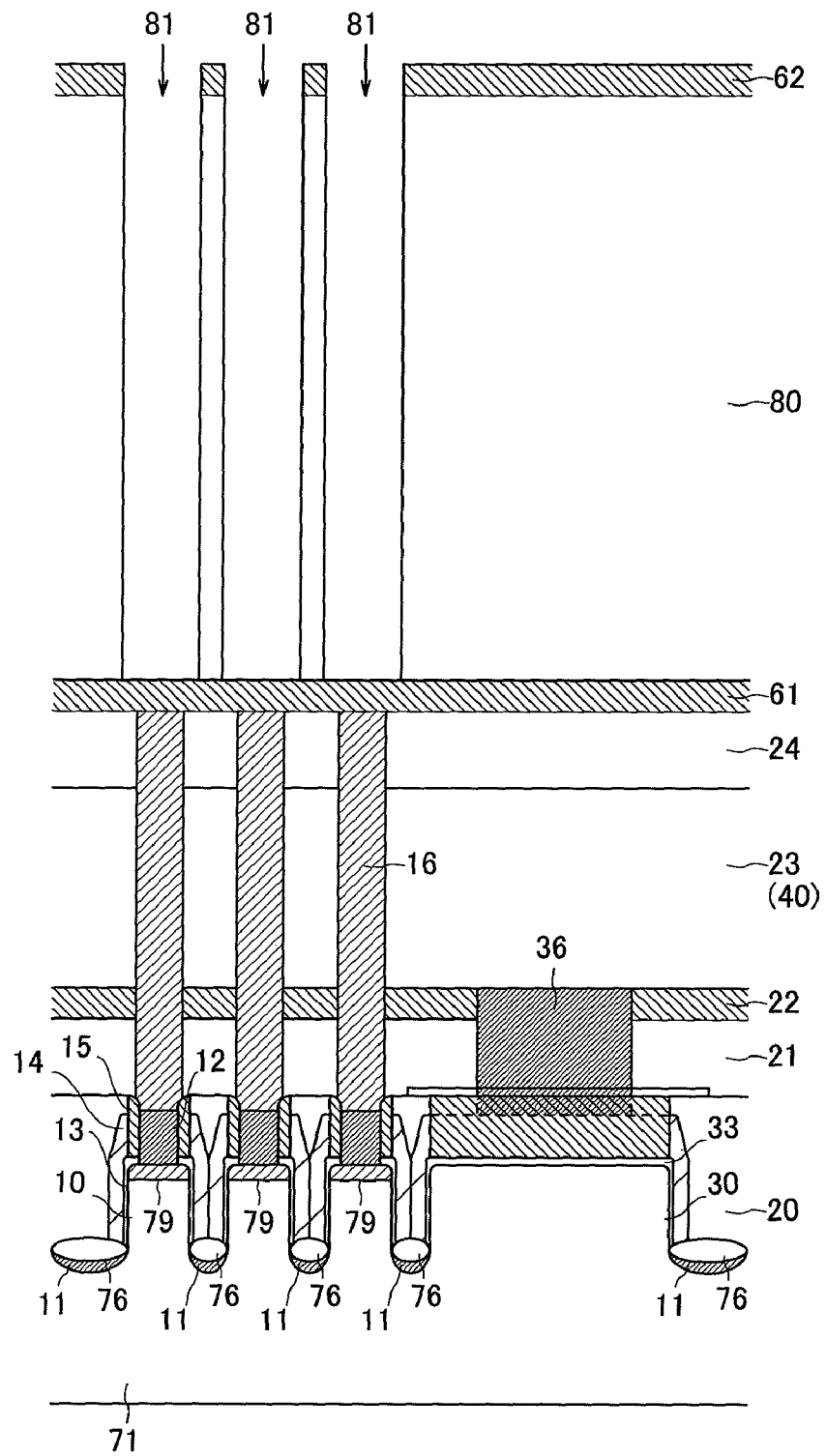
FIG. 34 is a schematic plan view showing a process for manufacturing the semiconductor device 10 according to the present embodiment (specifically forming cylinder hole 81)
Figure 35:
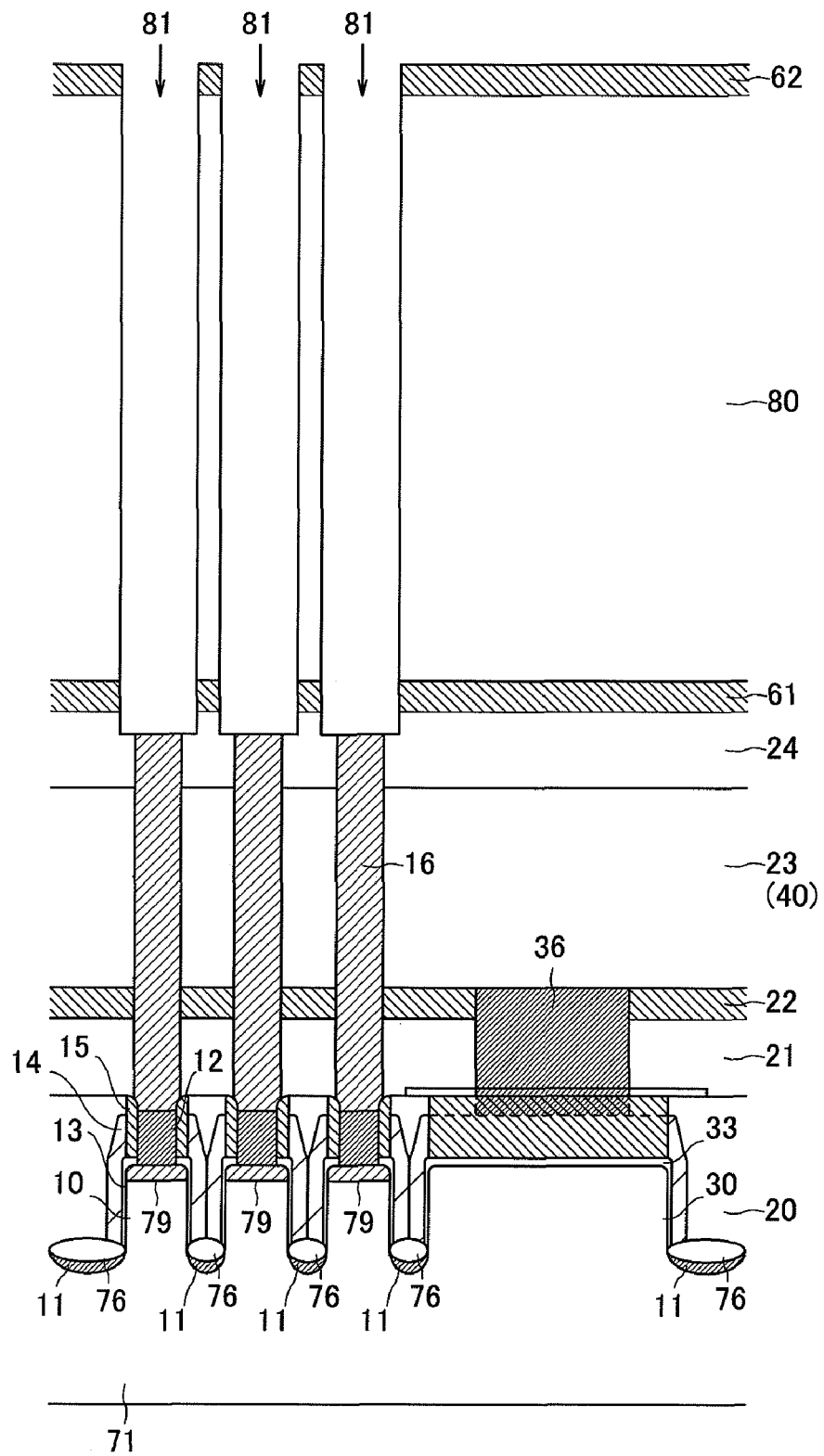
FIG. 35 is a schematic plan view showing a process for manufacturing the semiconductor device 10 according to the present embodiment (specifically forming cylinder holes 81 in depth)

Next, the capacitor Cp is formed. In forming the capacitor Cp, the interlayer insulation film 61 including a silicon nitride film, a dummy interlayer insulation film 80 including a silicon oxide film, and the interlayer insulation film 62 including a silicon nitride film are sequentially formed (FIG. 33). The interlayer insulation film 62 in the upper layer is patterned, and the dummy interlayer insulation film 80 is dry etched using the interlayer insulation film 62 as a hardmask, thereby forming a cylinder hole 81 right above the storage node contact 16 (FIG. 34). In this case, the interlayer insulation film 61 in the lower layer including a silicon nitride film constitutes the bottom surface of the cylinder hole 81. Further, the interlayer insulation film 61 in the lower layer is further dry etched to expose the upper end of the storage node contact 16 (FIG. 35).

Figure 36:
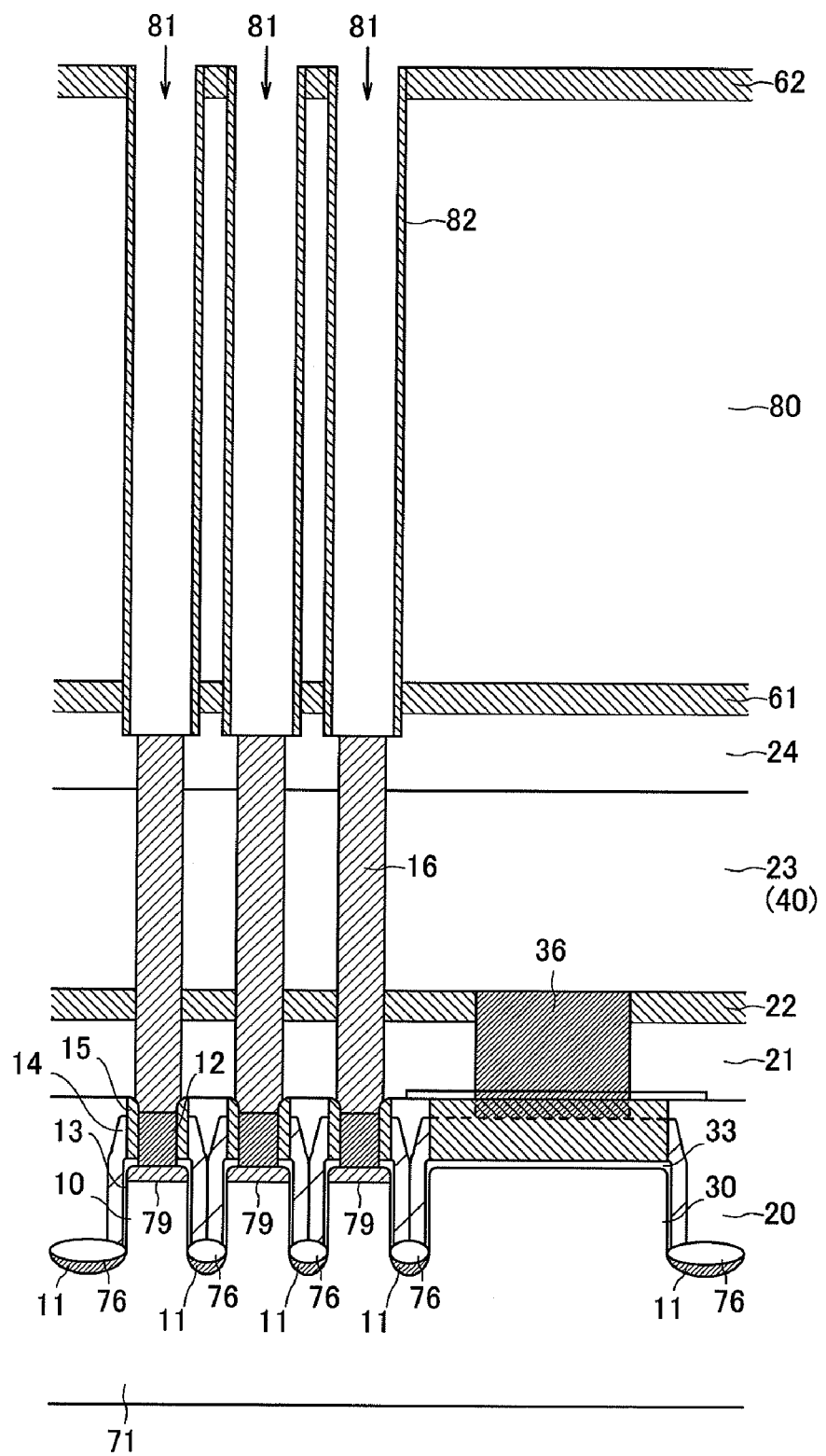
FIG. 36 is a schematic plan view showing a process for manufacturing the semiconductor device 10 according to the present embodiment (specifically forming sidewall insulation films 82)

Next, the sidewall insulation film 82 is formed within the cylinder hole 81 (FIG. 36). The sidewall insulation film 82 is formed by forming a silicon nitride film on the entire surface of the substrate, and then etching back the silicon nitride film. By forming the sidewall insulation film 82, damage of the capacitor Cp can be prevented in a cavity forming process described later.

Figure 37:
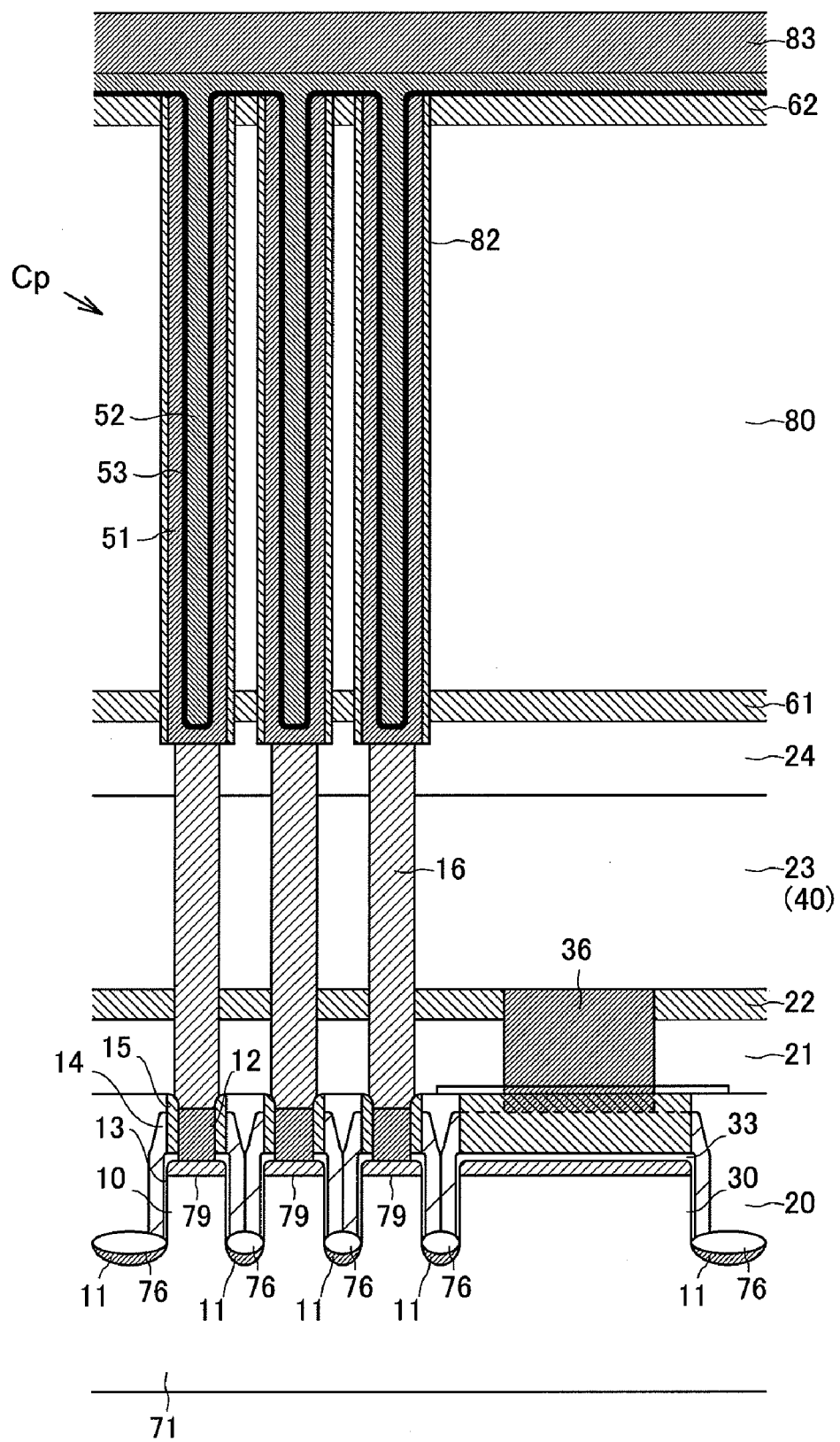
FIG. 37 is a schematic plan view showing a process for manufacturing the semiconductor device 10 according to the present embodiment (specifically forming lower electrode 51, capacitance insulation film 53, and upper electrode 52)
Figure 38:
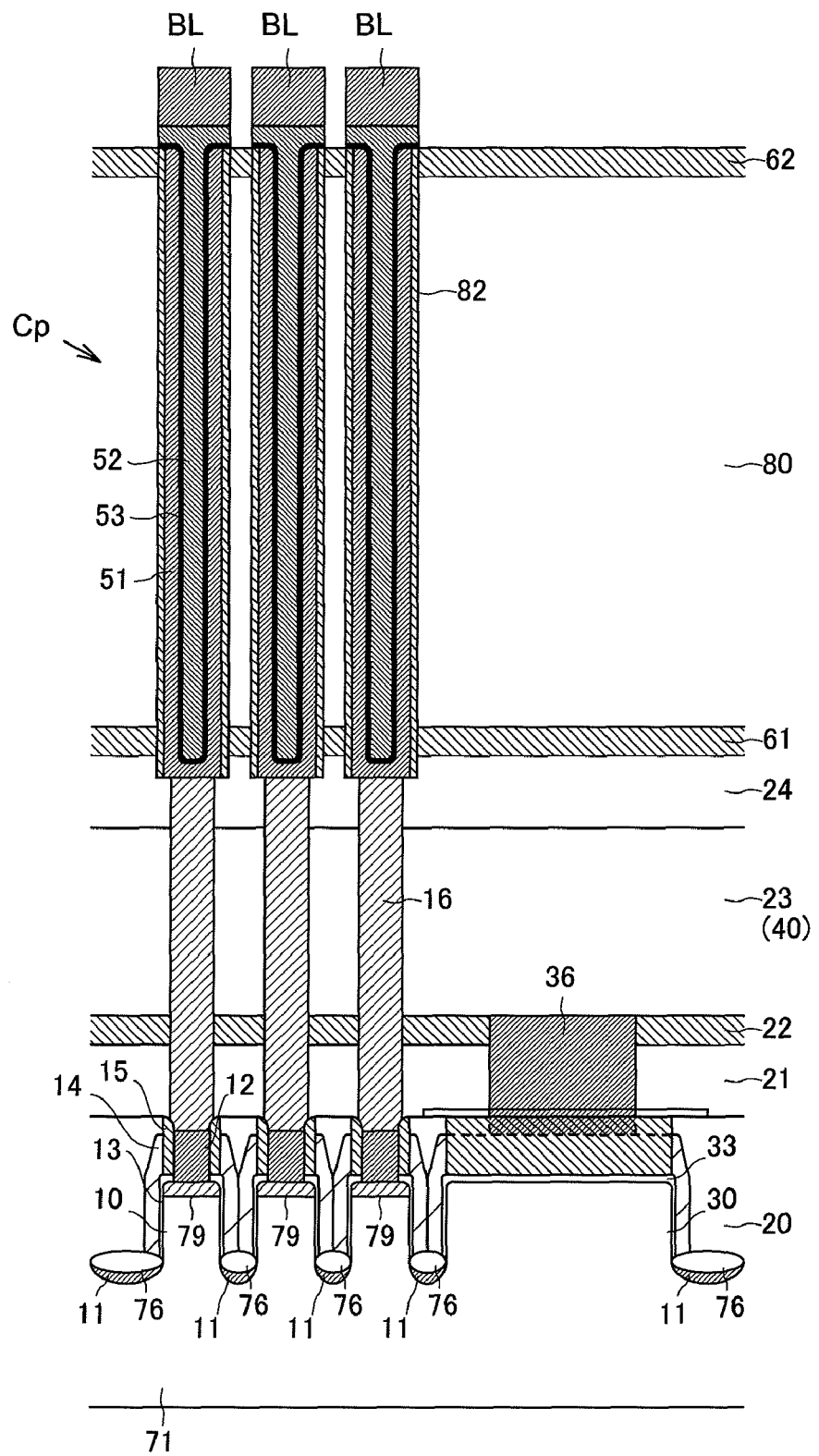
FIG. 38 is a schematic plan view showing a process for manufacturing the semiconductor device 10 according to the present embodiment (specifically forming word lines WL)

The lower electrode 51 is formed within the cylinder hole 81. Next, the capacitance insulation film 53, the upper electrode 52, and a refractory metal film 83 are formed in this order on the entire surface of the substrate (FIG. 37). Further, the capacitance insulation film 53, the upper electrode 52, and the refractory metal film 83 are patterned, thereby forming both the capacitor Cp and the bit line BL (FIG. 38).

Figure 39:
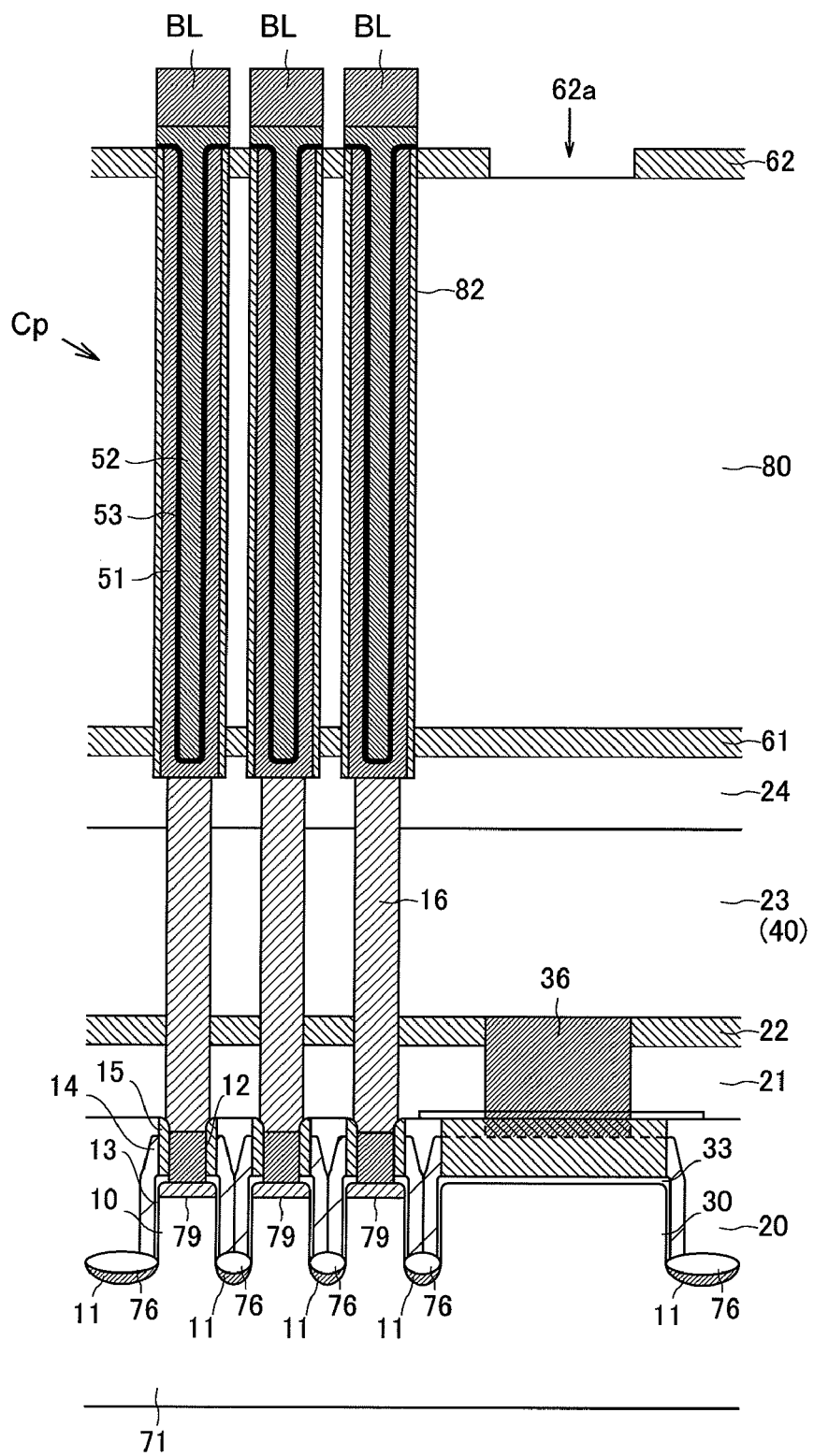
FIG. 39 is a schematic plan view showing a process for manufacturing the semiconductor device 10 according to the present embodiment (specifically forming a opening 62a)
Figure 40:
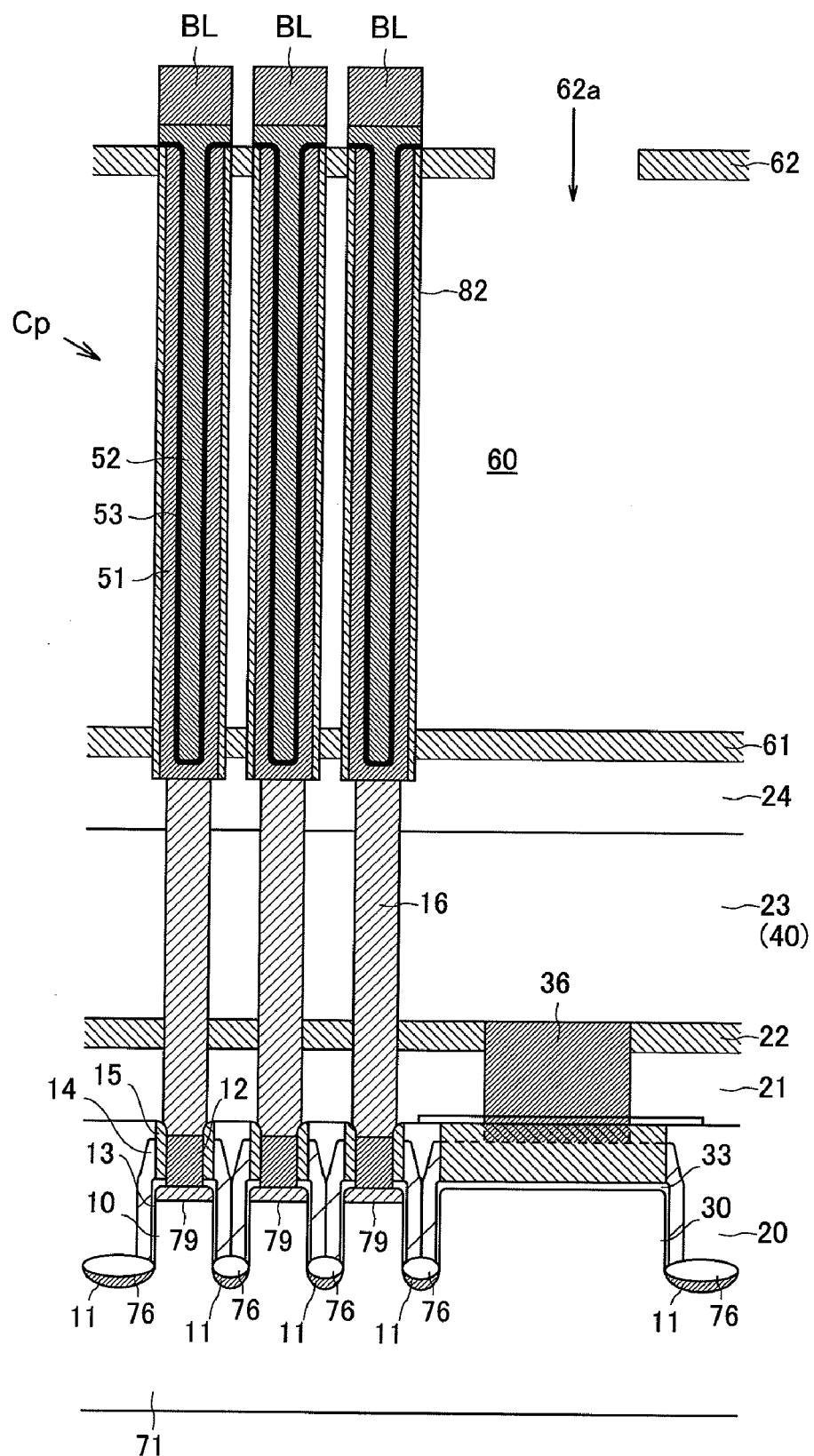
FIG. 40 is a schematic plan view showing a process for manufacturing the semiconductor device 10 according to the present embodiment (specifically forming a cavity 60 by wet etching)

Next, the cavity 60 is formed between the interlayer insulation film 61 and the interlayer insulation film 62. The cavity 60 is formed as follows. The opening 62a is first formed at the upper part of the dummy silicon pillar 30 by patterning the interlayer insulation film 62 (FIG. 39). An etchant is then introduced into the opening 62a, thereby removing the dummy interlayer insulation film 80 (FIG. 40). Preferably, the dummy interlayer insulation film 80 is dry etched to some extent via the opening 62a, and thereafter, the etchant is introduced into the opening 62a. Consequently, all the space in which the dummy interlayer insulation film 80 is present becomes the cavity 60, and most adjacent capacitors Cp are adjacent via the cavity 60. As a result, the capacitance between the capacitors can be substantially decreased.

The semiconductor memory device according to the present embodiment is completed by the above processes.

Figure 41:
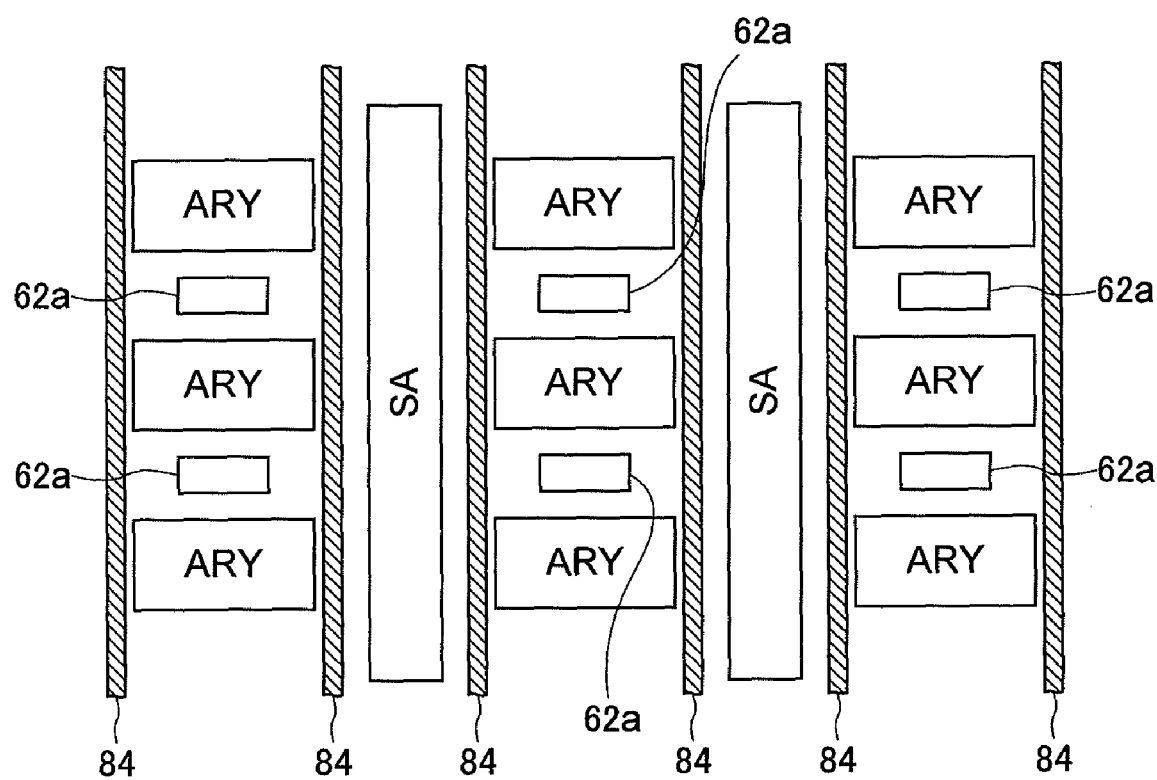
FIG. 41 is a schematic top plan view explaining a method for preventing unnecessary removing of the silicon oxide film formed in other than the cell array region.

At the time of removing the dummy interlayer insulation film 80 by wet etching, unnecessary removing of the silicon oxide film formed in other than the cell array region, such as regions of the sense amplifiers SA, needs to be prevented. For this purpose, the dummy capacitors 84 are linearly laid out so as to surround the cell array region ARY, as shown in FIG. 41 as a schematic top plan view. Accordingly, the etchant remains in the cell array region ARY, and the silicon oxide film in other than the cell array region is not unnecessarily removed. The dummy capacitors 84 are formed in the same process as that of the capacitor Cp, and therefore, the number of processes does not increase.

As explained above, according to the method of manufacturing a semiconductor memory device of the present embodiment, no complex process is necessary at the lower part of the silicon pillar 10. Therefore, the manufacturing process can be simplified.

By etching back the gate electrode, the gate electrode covering plural silicon pillars adjacent in the bit line direction is isolated. Therefore, the gate electrode does not require patterning, and the manufacturing process can be simplified. Because the dummy gate electrode 34 is formed to cover the dummy silicon pillar 30, the gate electrode 14 can be easily connected to the auxiliary word line 40 via the dummy gate electrode 34. Because the silicon pillar 10 and the dummy silicon pillar 30 can be simultaneously formed using a common mask, an interval between the two can be controlled in high precision. The gate electrode 14 formed on the silicon pillar 10 and the dummy gate electrode 34 formed on the dummy silicon pillar 30 can be connected securely.

The gate electrode 14 and the dummy gate electrode 34 are formed by leaving the hardmask 73 used to form the silicon pillar 10 and the dummy silicon pillar 30, and then, the hardmask 73 on the silicon pillar 10 is removed. Therefore, the through-hole 78 can be formed in self-alignment at the upper part of the silicon pillar 10. Consequently, by forming the second diffusion layer 12 within the through-hole 78, the second diffusion layer 12 can be formed in self-alignment to the silicon pillar 10.

Further, according to the present embodiment, the dummy interlayer insulation film 80 sandwiched between the upper and lower interlayer insulation films 61 and 62 is first formed, and then, the opening 62a is formed on the interlayer insulation film 62 in the upper layer. The dummy interlayer insulation film 80 is removed from the opening 62a by etching. Therefore, the surrounding of the capacitor Cp can become a cavity, and the bit line capacitance caused by the capacitor Cp can be substantially decreased. Particularly, the opening 62a is formed in the word line connection region WC, not in the cell array region ARY where many capacitors Cp are laid out in a matrix. Therefore, a vacant region in the word line connection region can be used effectively.

A device configuration of the semiconductor memory device according to the present embodiment where the memory element M is a phase-change element is explained next.

Figure 42:
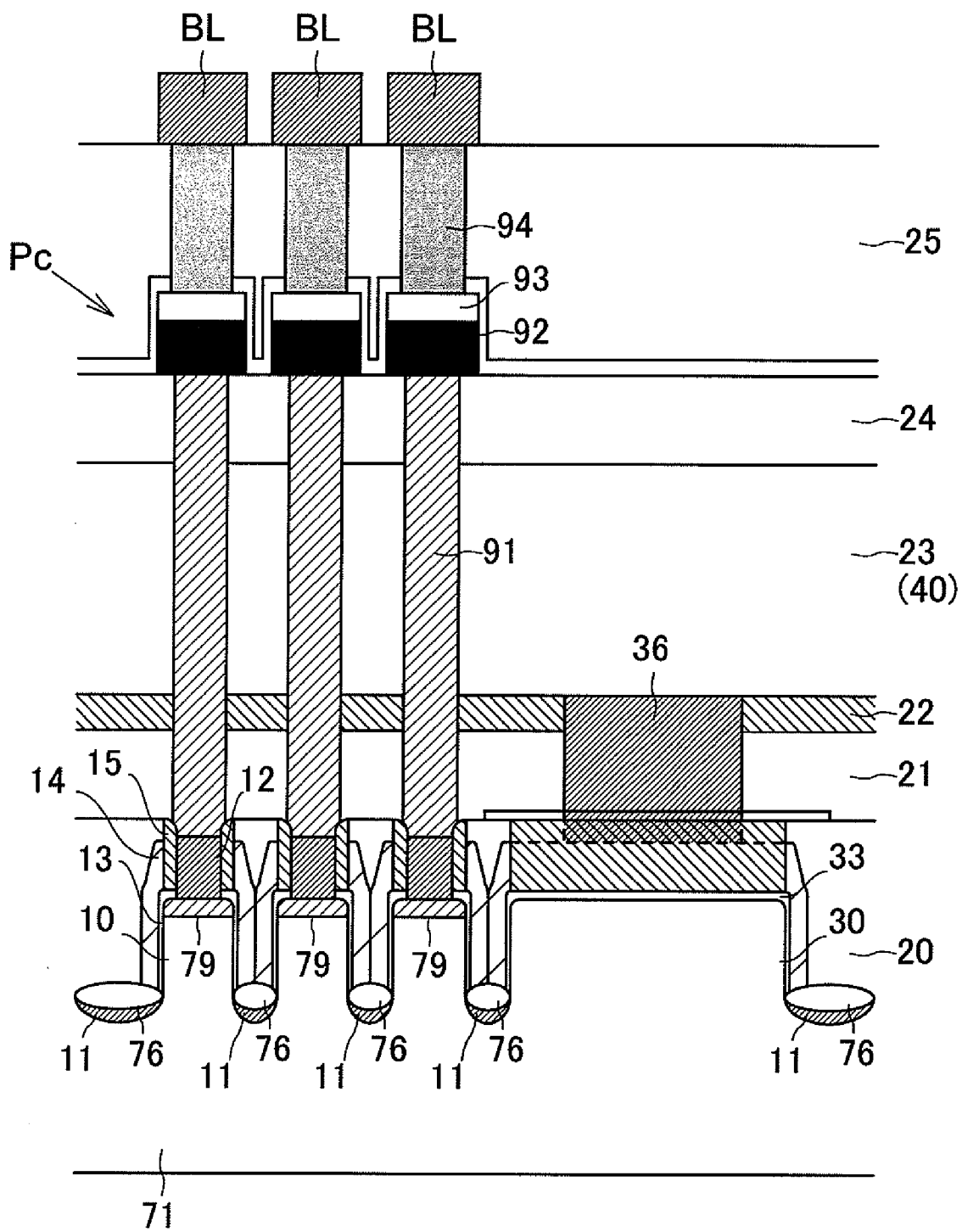
FIG. 42 is a schematic configuration diagram of a device configuration of a semiconductor memory device according to another preferred embodiment of the present invention.

FIG. 42 is a schematic cross-sectional view showing a configuration of a semiconductor memory device according to another preferred embodiment of the present invention.

As shown in FIG. 42, in the present embodiment, the phase-change element Pc is used as the memory element M of the memory cell MC shown in FIG. 2. The phase-change element Pc includes a lower electrode (heater plug) 91 connected to the second diffusion layer 12, an upper electrode 93 connected to the bit line BL via a bit contact 94, and a recording layer 92 provided between the lower electrode 91 and the upper electrode 93.

A phase change material is used for the recording layer 92. The phase change material is not particularly limited insofar as the material has two or more phase states and the electric resistance is different depending on the phase states. Preferably, a calcogenide material is selectively used. The calcogenide material is an alloy containing at least one of elements of germanium (Ge), antimony (Sb), tellurium (Te), indium (In), and selenium (Se). For example, there are binary elements such as GaSb, InSb, InSe, $Sb_2Te_3$, and GeTe, ternary elements such as $Ge_2Sb_2Te_5$, InSbTe, GaSeTe, $SnSb_2Te_4$, and InSbGe, and quaternary elements such as AgInSbTe, (GeSn) SbTe, GeSb(SeTe), $Te_{81}Ge_{15}Sb_2S_2$. In the present embodiment, preferably, $Ge_2Sb_2Te_5$ (GST) is selectively used. While the thickness of the recording layer 92 is not particularly limited, the thickness can be set to 10 nm to 200 nm, for example, in the present embodiment. The sputtering method can be used to form the recording layer 92.

The lower electrode 91 is used as a heater plug, and becomes a part of a heater at the data writing time. Therefore, for the material of the lower electrode 91, a material having relatively high electric resistance is preferably used such as metal silicide, metal nitride, and nitride of metal silicide. While not particularly limited, there can be preferably used a refractory metal and its nitride such as W, TiN, TaN, WN, and TiAlN, a refractory metal silicide such as TiSiN, and WSiN, and TiCN.

The upper electrode 93 serves to protect the recording layer 92 at the time of patterning the recording layer 92. For the material of the bit contact 94, a material having relatively low conductivity is preferably used to avoid escape of heat generated by current conduction. Specifically, a material such as TiAlN, TiSiN, and TiCN is preferably used, like the material for the lower electrode 91.

The semiconductor memory device having the above configuration can write and read data, by activating any one of the word lines by the word driver WD, and providing a current to at least one of the bit lines in this state. That is, since the cell transistor Tr in the memory cell MC in which the corresponding word line is activated turns ON state, the corresponding bit line is connected to the reference potential wiring PL via the phase-change element Pc. Accordingly, when a write current is provided to a predetermined bit line BL in this state, a phase of the recording layer 92 included in the phase-change element Pc can be changed to a crystal phase or an amorphous phase. When a read current is provided to the bit line BL, a current value changes depending on whether the recording layer 92 included in the phase-change element Pc is in the crystal phase or the amorphous phase. Therefore, data can be read based on the current value.

The present invention has thus been shown and described with reference to specific embodiments. However, it should be noted that the present invention is in no way limited to the details of the described arrangements but changes and modifications may be made without departing from the scope of the appended claims.

For example, in the above embodiments, the second diffusion layer 12 to be formed at the upper part of the silicon pillar 10 is formed by the selective epitaxial growth method. However, the method of forming the second diffusion layer 12 is not limited to this method, and a polycrystalline silicon film doped with an impurity may be embedded by the CVD method. When the selective epitaxial growth method is used, continuity of crystal can be secured, and more satisfactory transistor characteristic can be obtained. While the silicon pillar 10 and the second diffusion layer 12 are different parts in the above embodiments, the second diffusion layer 12 can be formed within the silicon pillar 10.

What is claimed is:

1. A semiconductor memory device comprising:
   a cell array region in which memory cells are laid out in a plurality of rows and columns, each of the memory cells including a cell transistor, an interlayer insulating film covering the cell transistor, a storage node contact piercing through the interlayer insulating film and connected at one end to the cell transistor, and a memory element provided over the interlayer insulating film and connected to the other end of the storage node contact; and
   a word line connection region provided adjacent to the cell array region,
   the cell transistor of each of the memory cells comprising a silicon pillar formed substantially perpendicularly to a main surface of a substrate, first and second diffusion layers provided respectively at a lower part and an upper part of the silicon pillar, a gate electrode covering a side surface of the silicon pillar via a gate insulation film, the second diffusion layer being connected to the storage node contact,
   the word line connection region comprising a plurality of dummy silicon pillars formed substantially perpendicularly to the main surface of the substrate and arranged in at least one column, and a plurality of dummy gate electrodes covering a side surface of an associated one of the dummy silicon pillars via a dummy gate insulation film,
   the gate electrodes of the cell transistors belonging to a same row being merged with each other to provide a plurality of word lines correspondingly to the rows,
   each of the dummy gate electrodes connected to an associated one of the word lines; and
   the semiconductor memory device further comprising a plurality of auxiliary word lines formed in the cell array region, each of the auxiliary word lines buried in the interlayer insulating film and in contact with an associated one of the dummy gate electrodes so that each of the auxiliary word line is electrically connected to an associated one of the word lines through the associated one of the dummy gate electrodes.

2. The semiconductor memory device as claimed in claim 1, wherein the auxiliary word lines represent a smaller electric resistance than the gate electrodes.

3. The semiconductor memory device as claimed in claim 1, further comprising:
   an insulation layer provided under the interlayer insulating film to fill gaps among the respective second diffusion layers of the cell transistors of each of the memory cells.

4. The semiconductor memory device as claimed in claim 3, further comprising:
   a cylindrical sidewall insulation film intervening between each of the respective second diffusion layers and the insulating layer to surround side surfaces of each of the respective second diffusion layers.

5. The semiconductor memory device as claimed in claim 4, wherein a side surface of the cylindrical sidewall insulation film and the side surface of the silicon pillar are substantially aligned with each other in a direction perpendicular to the main surface of the substrate.

6. The semiconductor memory device as claimed in claim 3, wherein the insulating layer fills intervals between adjacent ones of the word lines.

7. The semiconductor memory device as claimed in claim 1, wherein the gate electrodes of the cell transistors belonging to the same row are merged with each other by substantially completely filling intervals between adjacent ones of the silicon pillars of the cell transistors belonging to the same row.

8. The semiconductor memory device as claimed in claim 1, wherein the memory element comprises a capacitor.

9. The semiconductor memory device as claimed in claim 1, wherein the memory element comprises a phase-change element.

10. A semiconductor memory device comprising:
a plurality of cell transistors, each of the cell transistors including a silicon pillar formed substantially perpendicularly to a main surface of a substrate, a gate electrode covering a side surface of the silicon pillar via a gate insulation film, and first and second diffusion layers provided respectively at lower and upper parts of the silicon pillar;
a first interlayer insulating layer covering the cell transistors;
a plurality of storage node contacts each buried in the first interlayer insulating layer, the plurality of the storage node contacts in contact with the second diffusion layer of an associated one of the cell transistors;
a second interlayer insulating layer provided over the first interlayer insulating layer with a cavity therebetween, the cavity being substantially free from being filled with an insulating material to maintain an air gap between the first and second interlayer insulating layers; and
a plurality of capacitors each including a lower portion, an upper portion, and a middle portion, the lower portion of each of the capacitors embedded in the first interlayer insulating layer and in contact with an associated one of the second diffusion layers of the cell transistors, the upper portion of each of the capacitors embedded in the second interlayer insulating layer, and the middle portion of each of the capacitors disposed in the air gap.

11. The semiconductor memory device as claimed in claim 10, wherein the capacitors are isolated from each other by the air gap.

12. The semiconductor memory device as claimed in claim 11, wherein each of the first and second interlayer insulating layer comprises a silicon nitride film.

13. The semiconductor memory device as claimed in claim 10, wherein each of the capacitors include a lower electrode, a dielectric insulation film, and a upper electrode, and an outer side surface of the lower electrode is covered by a sidewall insulation film comprising a silicon nitride.

14. The semiconductor memory device as claimed in claim 10, further comprising a plurality of bit lines each connected to the respective upper portion of an associated one or ones of the capacitors.

15. A device comprising:
a memory cell area comprising:
a plurality of cell transistors arranged in a line, each of the cell transistors including a silicon pillar protruding from a substrate and first and second diffusion regions provided respectively at lower and upper portions of the silicon pillar, the silicon pillar including a middle portion between the lower and upper portions which functions as a channel region,
an interlayer insulating layer covering the cell transistors, and
a plurality of storage elements each provided over the interlayer insulating layer and electrically connected at one end to the second diffusion region of the associated one of the cell transistors; and
a word line connection region provided adjacent to the memory cell area;
the memory cell area further comprising:
a word line extended along the cell transistors to include a plurality of gate electrode portions, each of the gate electrode portions facing a channel region of the silicon pillar of an associated one of the cell transistors with an intervention of an insulating film therebetween, the word line further extended to a word line connecting area to provide an extended portion in the word line connection region, and
an auxiliary word line provided in the interlayer insulating layer and substantially parallel to the word line with a separation therefrom by the interlayer insulating layer, the auxiliary word line extends to the word line connecting area to provide an elongated portion in the word line connection region; and
the word line connection region comprising a contact plug connecting the extended portion of the word line and the elongated portion of the auxiliary word line with each other so that the auxiliary word line is electrically connected to the word line.

16. The device as claimed in claim 15, wherein the word line connecting area further comprises a dummy silicon pillar protruding from the substrate, and the extended portion of the word line serving as a dummy gate electrode that is provided over a side surface the dummy silicon pillar with an intervention of an insulating film therebetween.

17. The device as claimed in claim 16, wherein the word line comprises a poly-silicon layer and the auxiliary word line comprises a metal layer.

18. The device as claimed in 15, wherein the memory cell area further comprises a plurality of bit lines each connected to the other end of an associated one of the storage elements, each of the word line and the auxiliary word line running in a first direction and each of the bit lines running in a second direction crossing the first direction.

* * * * *